(12) United States Patent
Choi et al.

(10) Patent No.: US 12,245,385 B2
(45) Date of Patent: Mar. 4, 2025

(54) ROLLABLE ELECTRONIC DEVICE

(71) Applicant: Samsung Electronics Co., Ltd., Suwon-si (KR)

(72) Inventors: Junyoung Choi, Suwon-si (KR); Youngmin Kang, Suwon-si (KR); Moonchul Shin, Suwon-si (KR); Yeonggyu Yoon, Suwon-si (KR); Seungjoon Lee, Suwon-si (KR); Joongyeon Cho, Suwon-si (KR); Junghyun Ahn, Suwon-si (KR); Byounguk Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 313 days.

(21) Appl. No.: 17/652,036

(22) Filed: Feb. 22, 2022

(65) Prior Publication Data
US 2022/0201880 A1 Jun. 23, 2022

Related U.S. Application Data

(63) Continuation of application No. PCT/KR2021/019708, filed on Dec. 23, 2021.

(30) Foreign Application Priority Data

Dec. 23, 2020 (KR) .................. 10-2020-0182461
Jun. 23, 2021 (KR) .................. 10-2021-0081692

(51) Int. Cl.
*H05K 5/00* (2006.01)
*G06F 1/16* (2006.01)
*H05K 5/02* (2006.01)

(52) U.S. Cl.
CPC ......... *H05K 5/0217* (2013.01); *G06F 1/1624* (2013.01); *G06F 1/1652* (2013.01); *H05K 5/0017* (2013.01)

(58) Field of Classification Search
CPC .. H05K 5/0217; H05K 5/0017; G06F 1/1624; G06F 1/1652
(Continued)

(56) References Cited

U.S. PATENT DOCUMENTS 10,742,784 B1 8/2020 Jo et al.
2017/0142847 A1* 5/2017 Park .................. H05K 5/0226
(Continued)

FOREIGN PATENT DOCUMENTS

EP 3955236 A1 2/2022
KR 10-2017-0050270 A 5/2017
(Continued)

OTHER PUBLICATIONS

International Search Report and Written Opinion of the International Searching Authority in connection with International Application No. PCT/KR2021/019708 issued Mar. 29, 2022, 14 pages.
(Continued)

*Primary Examiner* — Zhengfu J Feng

(57) ABSTRACT

An electronic device according to various embodiments of the disclosure may include a first housing, a second housing, a flexible display, a bendable member, and a bending plate. The second housing may slide in a first housing to cause at least a part of the second housing to be drawn out of the first housing in an open state, and may slide in a second direction to cause the at least a part of the second housing to enter the first housing in a closed state. The flexible display may be disposed in a space formed by the first housing and the second housing, and may include a first area visible to an outside, and a second area extending from the first area, accommodated inside the flexible display in a closed state, and visible to the outside in an open state. The bendable member may be disposed on a rear side of the flexible display to support the flexible display in the closed state and
(Continued)

in the open state, and may include a plurality of multi-bars disposed at predetermined intervals. The bending plate may be attached to the flexible display and the plurality of multi-bars.

18 Claims, 28 Drawing Sheets

(58) Field of Classification Search
USPC .......................................................... 361/807
See application file for complete search history.

(56) References Cited

U.S. PATENT DOCUMENTS

| | | | |
|---|---|---|---|
| 2017/0364119 A1 | 12/2017 | Lee et al. | |
| 2018/0103552 A1 | 4/2018 | Seo et al. | |
| 2019/0261519 A1 | 8/2019 | Park et al. | |
| 2019/0268455 A1 | 8/2019 | Baek et al. | |
| 2020/0120814 A1* | 4/2020 | Huang | H04M 1/0268 |
| 2020/0177718 A1 | 6/2020 | Cao | |
| 2020/0253069 A1* | 8/2020 | Cha | G06F 1/1681 |
| 2020/0264660 A1* | 8/2020 | Song | G06F 1/1624 |
| 2021/0208629 A1* | 7/2021 | Jo | H04M 1/0268 |
| 2021/0385315 A1* | 12/2021 | Cha | G06F 1/1675 |
| 2022/0155823 A1 | 5/2022 | Shin et al. | |

FOREIGN PATENT DOCUMENTS

| | | | |
|---|---|---|---|
| KR | 10-2017-0057500 A | 5/2017 | |
| KR | 10-2017-0141438 A | 12/2017 | |
| KR | 10-2018-0040181 A | 4/2018 | |
| KR | 10-2019-0101184 A | 8/2019 | |
| KR | 10-2019-0101605 A | 9/2019 | |
| KR | 10-2020-0012359 A | 2/2020 | |
| KR | 10-2020-0095307 A | 8/2020 | |
| KR | 10-2020-0117741 A | 10/2020 | |
| KR | 10-2020-0124989 A | 11/2020 | |
| KR | 10-2022-0008732 A | 1/2022 | |
| KR | 10-2022-0117330 A | 8/2022 | |
| KR | 10-2022-0150924 A | 11/2022 | |
| WO | 2020209425 A1 | 10/2020 | |

OTHER PUBLICATIONS

Supplementary European Search Report dated Mar. 19, 2024, in connection with European Patent Application No. 21911570.6, 8 pages.

* cited by examiner

< TAPE >

< WELDING >

< BONDING >

ROLLABLE ELECTRONIC DEVICE

CROSS-REFERENCE TO RELATED APPLICATIONS

This application is a continuation of International Application No. PCT/KR2021/019708, filed Dec. 23, 2021, which claims priority to Korean Patent Application No. 10-2020-0182461, filed Dec. 23, 2020, and Korean Patent Application No. 10-2021-0081692, filed Jun. 23, 2021, the disclosures of which are herein incorporated by reference in their entirety.

BACKGROUND

1. Field

Various embodiments of the disclosure relate to a rollable electronic device.

2. Description of Related Art

An electronic device has gradually become slimmer, and has been improved so as to increase stiffness, reinforce the design aspect, and differentiate functional elements thereof at the same time. The electronic device has been deviated from the uniform rectangular shape, and has been gradually changed to various shapes. The electronic device may have a transformable structure which is convenient to carry and which can use a large-screen display. For example, as an example of a transformable structure, the electronic device may have a structure (e.g., rollable structure or slidable structure) which can vary a display area of a flexible display through support of housings operating in a sliding manner with each other. The rollable electronic device (or slidable electronic device) may be configured so that a flexible display is rolled or unfolded. The slidable electronic device may be composed so that the flexible display moves in a sliding manner to extend or retract a portion of a screen.

SUMMARY

When a bendable section of a display moves in a first direction (e.g., x-axis direction) via a bending part of the electronic device, a compressive force is applied, and intervals between multi-bars of a bendable member become narrower. If the intervals between the multi-bars become narrower, interference may occur between the multi-bars, and local compressive force and tensile stress may occur in a section between the multi-bars. Due to such compressive force and tensile stress, the display may get loose and may be deformed. Various embodiments of the disclosure provide a bending plate and an electronic device including the same, which can reduce tensile stress due to narrowing of intervals between multi-bars on the bending part of the electronic device.

An electronic device according to various embodiments of the disclosure may include a first housing, a second housing, a flexible display, a bendable member, and a bending plate. The second housing may slide in a first housing to cause at least a part of the second housing to be drawn out of the first housing in an open state, and may slide in a second direction to cause the at least a part of the second housing to enter the first housing in a closed state. The flexible display may be disposed in a space formed by the first housing and the second housing, and may include a first area visible to an outside, and a second area extending from the first area, accommodated inside the flexible display in the closed state, and visible to the outside in the open state. The bendable member may be disposed on a rear surface of the flexible display to support the flexible display in the closed state and in the open state, and may include a plurality of multi-bars disposed at predetermined intervals. The bending plate may be attached to the flexible display and the plurality of multi-bars.

A display assembly of an electronic device according to various embodiments of the disclosure may include a flexible display, a bendable member, and a bending plate. The flexible display may include a first area disposed to be visible from an outside, and a second area extending from the first area, accommodated inside the flexible display in a closed state, and disposed to be visible from the outside in an open state. The bendable member may be disposed on a rear side of the flexible display to support the flexible display in the closed state and in the open state, and may include a plurality of multi-bars disposed at predetermined intervals. The bending plate may be attached to a lower part of the flexible display, and may be attached to the plurality of multi-bars.

The technical subject intended to be achieved in the disclosure is not limited to those as described above, and other unmentioned technical subjects can be clearly understood by those of ordinary skill in the art to which the disclosure pertains from the following description.

According to the electronic device according to various embodiments of the disclosure, since the bending plate is disposed between the display and the bendable member, the bendable member can be flexibly bent by the bending plate, and since the bending part of the electronic device reduces the compressive force and the tensile stress applied to the multi-bars, it can be reduced that the display gets loose or is deformed.

In addition, various effects from grasping directly or indirectly through this document can be provided.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 22, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
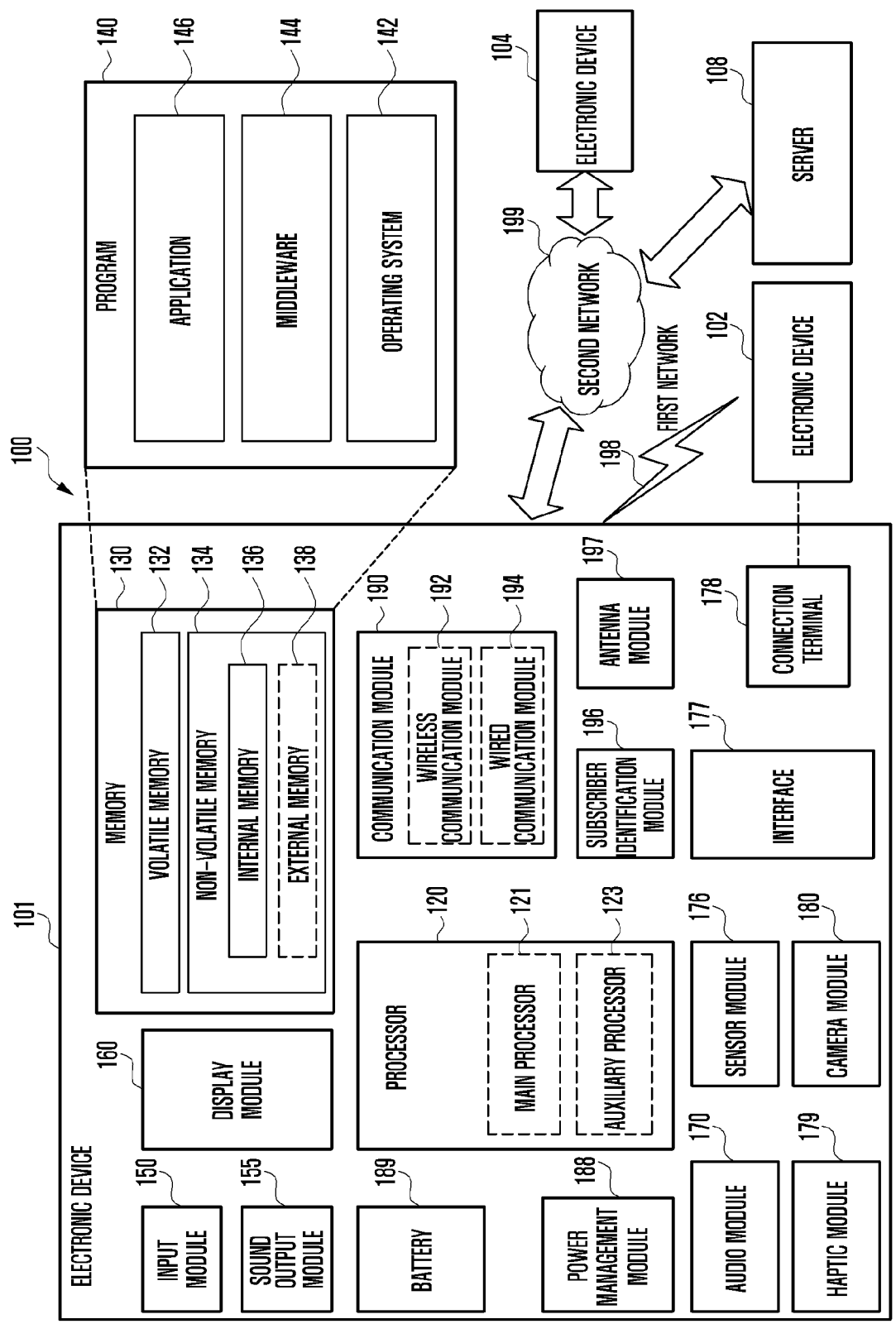
FIG. 1 is a block diagram of an electronic device in a network environment according to various embodiments of the disclosure.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to an embodiment, a display module 160 illustrated in FIG. 1 may include a flexible display composed to be folded or unfolded.

According to an embodiment, the display module 160 illustrated in FIG. 1 may include the flexible display slidably disposed to provide a screen (e.g., display screen).

For example, a display area of an electronic device 101 is an area visually exposed to be able to output an image, and the electronic device 101 can adjust a width of the display area in accordance with a movement of a housing or a movement of the display. Since at least a part (e.g., housing) of the electronic device 101 slidably operates at least partly, a rollable electronic device configured to accommodate a selective expansion of the display area may be an example including the above display module 160. For example, the display module 160 may be called a slide-out display or an expandable display.

Figure 2:
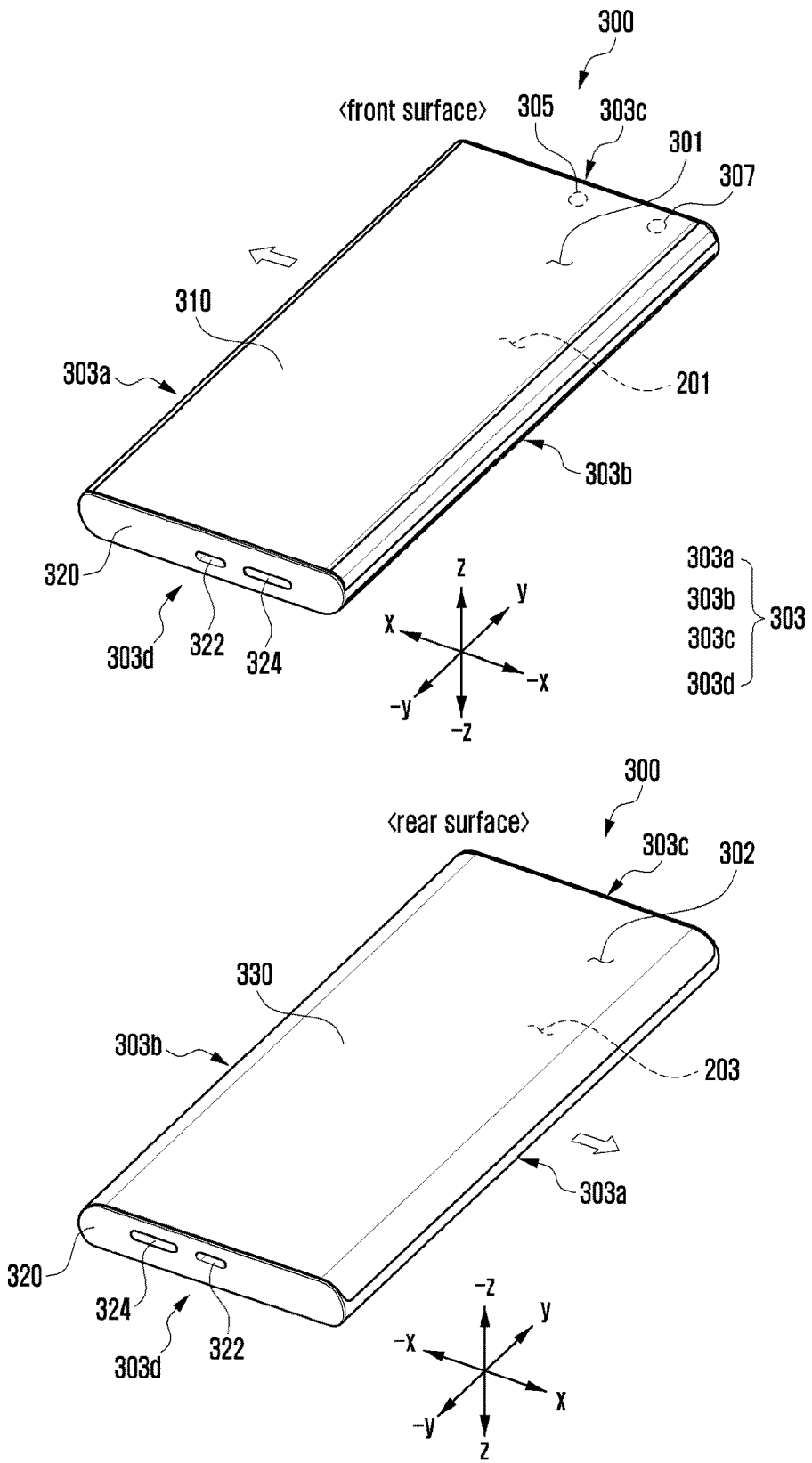
FIG. 2 is a view illustrating a front surface (e.g., first surface) and a rear surface (e.g., second surface) of a rollable electronic device in a first state (e.g., in a closed state) according to various embodiments of the disclosure.

FIG. 2 is a view illustrating a front surface (e.g., first surface) and a rear surface (e.g., second surface) of a rollable electronic device in a first state (e.g., in a closed state) according to various embodiments of the disclosure.

According to various embodiments, an electronic device 300 of FIG. 2 may include the electronic device 101 of FIG. 1.

Referring to FIG. 2, the electronic device 300 (e.g., rollable electronic device) according to various embodiments of the disclosure may include a first plate 201 directed in a first direction (e.g., front surface) and a second plate 203 directed in a second direction (e.g., rear surface) that is opposite to the first direction (e.g., front surface). The electronic device 300 may include a housing 320 (e.g., first housing 360 and second housing 370 of FIGS. 3 and 4) forming a space between the first plate 201 and the second plate 203, and a display 310 (e.g., display 310 of FIGS. 3 and 4 and display 610 of FIG. 6) visually exposed through the first plate 201. Here, an OLED display or an LCD display may be applied as the display 310. According to an embodiment, a part of the first plate 201 may be formed to be substantially transparent. For example, the first plate 201 may be formed by a glass plate or a polymer plate including various coating layers.

The electronic device 300 may include a front surface 301 (e.g., first surface) directed in a first direction (e.g., z-axis direction), a rear surface 302 (e.g., second surface) directed in a second direction (e.g., −z-axis direction) that is opposite to the first direction, a lateral surface 303 formed between the front surface 301 and the rear surface 302, and a predetermined space provided between the front surface 301 and the rear surface 302. The lateral surface 303 may include a first lateral surface 303a disposed in an x-axis direction, a second lateral surface 303b disposed in a −x-axis direction, a third lateral surface 303c disposed in a y-axis direction, and a fourth lateral surface 303d disposed in a −y-axis direction.

According to an embodiment, the electronic device 300 may slide in at least one direction of the x-axis direction, −x-axis direction, y-axis direction, and/or −y-axis direction to expand or reduce a visible size for the screen of the display 310. In the disclosure, it may be explained as an example that the electronic device 300 slides from a reduction state in the x-axis direction to expand a visible size for the screen of the display 310. Further, it may be explained as an example that the electronic device 300 in an expanded state slides in the −x-axis direction to reduce the screen of the display 310. However, the electronic device 300 is not limited thereto, and may be configured so that the screen of the display 310 is expanded and reduced in the x-axis direction and −x-axis direction (e.g., both directions based on the x axis). Meanwhile, the electronic device 300 may be configured so that the screen of the display 310 is expanded and reduced in the y-axis direction and −y-axis direction (e.g., both directions based on the y axis).

According to an embodiment, the housing 320 may be formed of a metal material to surround a space between the front side 301 and the rear side 302 of the electronic device 300. As an embodiment, at least a part of the housing 320 may be formed of a non-metal material. On the front side 301 of the electronic device 300, the display 310 may be visually exposed to an outside. On the rear side 302 of the electronic device 300, a back cover 330 (e.g., back cover 690 of FIG. 6) (e.g., rear cover) may be visually exposed to the outside. The back cover 330 may be formed of polymer, coated or colored glass, ceramic, metal (e.g., aluminum, stainless steel (STS), or magnesium), or a combination of at least two of the above materials.

According to an embodiment, the electronic device 300 may include a connector hole 322 and an audio hole 324. As an embodiment, the connector hole 322 may accommodate a first connector for transmitting and receiving power and/or data to and from an external electronic device, and/or a second connector for transmitting and receiving an audio signal to and from the external electronic device. For example, the connector hole 322 may include a USB connector or an earphone jack. In an embodiment, the USB connector and the earphone jack may be implemented by a single hole. According to an embodiment, the electronic device 300 may transmit and receive the power and/or data to and from the external electronic device or transmit and receive the audio signal wirelessly without any separate connector hole. As an embodiment, the audio hole 324 may include a microphone hole and/or a speaker hole. As an embodiment, the electronic device 300 may include an audio module (e.g., audio module 170 of FIG. 1). The audio module may include a microphone for acquiring an external sound and a speaker for outputting sound to the outside. At least one microphone and at least one speaker may be disposed inside the audio hole 324. As an embodiment, a speaker hole and a microphone hole may be implemented by a sigle audio hole 324, or a speaker (e.g., piezo-electric speaker) may be included without the speaker hole. The speaker hole may include an external speaker hole and a call receiver hole.

According to an embodiment, the electronic device 300 may include at least one of an input module (e.g., input module 150 of FIG. 1), a sound output module (e.g., sound output module 155 of FIG. 1), a sensor module 307 (e.g., sensor module 176 of FIG. 1), a camera module 305 (e.g., camera module 180 of FIG. 1), and a connector port (e.g., connection terminal 178 of FIG. 1). As an example, the camera module 305 (e.g., camera module 180 of FIG. 1) and the sensor module 307 (e.g., sensor module 176 of FIG. 1) may be disposed at a lower part of the display 310. As another embodiment, the electronic device 300 may be composed to omit at least one of the above-described constituent elements or to additionally include other constituent elements.

As an embodiment, the sensor module 307 (e.g., sensor module 176 of FIG. 1) may generate an electrical signal or a data value corresponding to an operation state inside the electronic device 300 or an external environment state.

As an embodiment, the sensor module 307 (e.g., sensor module 176 of FIG. 1) may include a first sensor module (e.g., proximity sensor or illuminance sensor) disposed on the front side 301 of the electronic device 300 and a second sensor module (e.g., heart rate monitoring (HRM) sensor) disposed on the rear side 302.

As an embodiment, the first sensor module may be disposed under (e.g., on the lower part of) the display 310 on the front side 301 of the electronic device 300. According to an embodiment, the first sensor module may include at least one of a proximity sensor, an illuminance sensor, a time of flight (TOF) sensor, an ultrasonic sensor, a fingerprint recognition sensor, a gesture sensor, a gyro sensor, a barometric pressure sensor, a magnetic sensor, an acceleration sensor, a grip sensor, a color sensor, an infrared (IR) sensor, a biosensor, a temperature sensor, or a humidity sensor.

According to an embodiment, the electronic device 300 may include at least one antenna (e.g., antenna module 197 of FIG. 1). According to an embodiment, for example, the at least one antenna (e.g., antenna module 197 of FIG. 1) may be configured to transmit and receive signals for wireless communication to and from an external electronic device (e.g., electronic device 104 of FIG. 1). According to an embodiment, the electronic device 300 may include another antenna disposed in the inner space of the electronic device 300. According to an embodiment, the other antenna may wirelessly transmit and receive a power required for charging. According to an embodiment, the at least one antenna and/or the other antenna may include a legacy antenna, a mmWave antenna, a near field communication (NFC) antenna, a wireless charging antenna, and/or a magnetic secure transmission (MST) antenna.

As an embodiment, a first state (e.g., closed state) of the electronic device 300 may be expressed as a screen reduction state, slide-in state, or slide-close state. As an embodiment, a second state (e.g., open state) of the electronic device 300 may be expressed as a screen expansion state, slide-out state, or slide-open state.

In an embodiment, if the display 310 moves for a set distance by an external force, the electronic device 300 may be switched from a closed state to an open state, or from the open state to the closed state without any further external force (e.g., semi-automatic slide operation).

In another embodiment, if a signal is generated through an input device included in the electronic device 300, the electronic device 300 may be switched from the closed state to the open state, or from the open state to the closed state by a motor or a driving device, such as a hinge, connected to the display 310. For example, if a signal is generated through a hardware button or a software button provided through the screen, the electronic device 300 may be switched from the closed state to the open state, or from the open state to the closed state.

In another embodiment, if a signal is generated from various sensors, such as a pressure sensor, the electronic device 300 may be switched from the closed state to the open state, or from the open state to the closed state. For example, when the electronic device 300 is carried or gripped by the hand, a squeeze gesture that a part of the hand (e.g., palm or fingerprint) presses an inside of a designated section of the electronic device 300 can be detected through a sensor, and in correspondence to this, the electronic device 300 can be switched from the closed state to the open state, or from the open state to the closed state.

Figure 3:
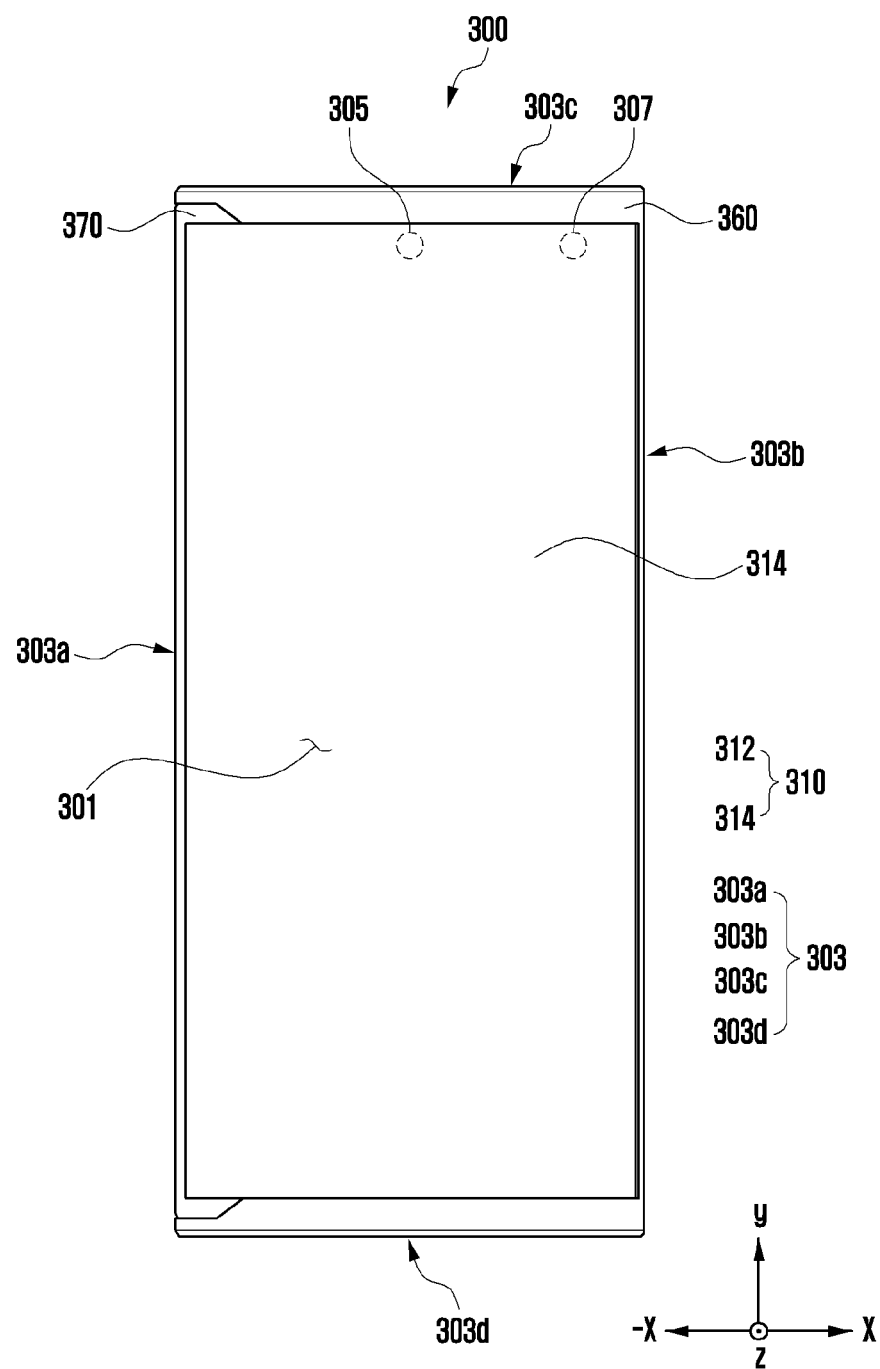
FIG. 3 is a view illustrating a front surface (e.g., first surface) (e.g., surface on which a screen is displayed) of an electronic device in a first state (e.g., closed state) according to various embodiments of the disclosure.
Figure 4:
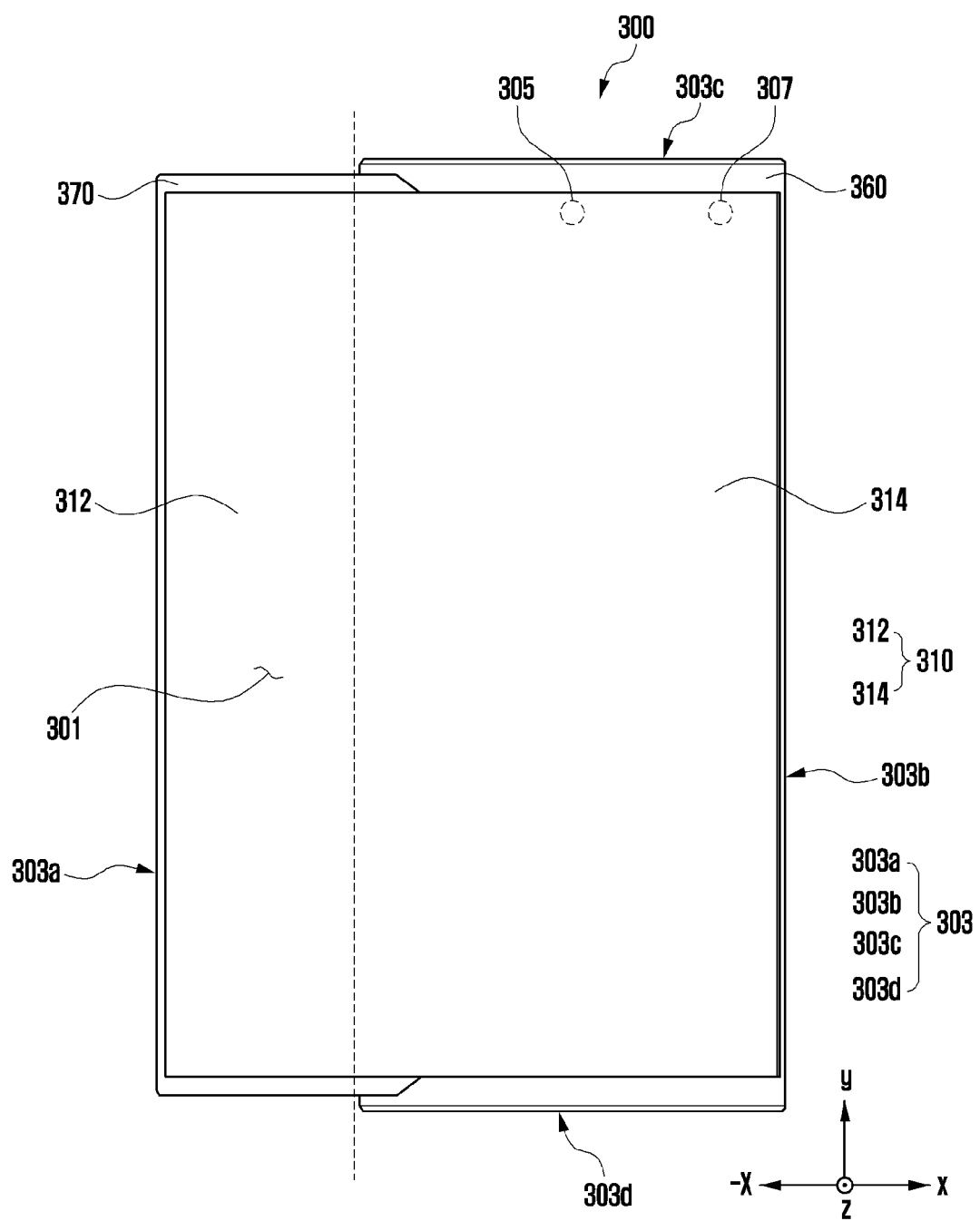
FIG. 4 is a view illustrating a front surface (e.g., first surface) (e.g., surface on which a screen is displayed) of an electronic device in a second state (e.g., open state) according to various embodiments of the disclosure.
Figure 5:
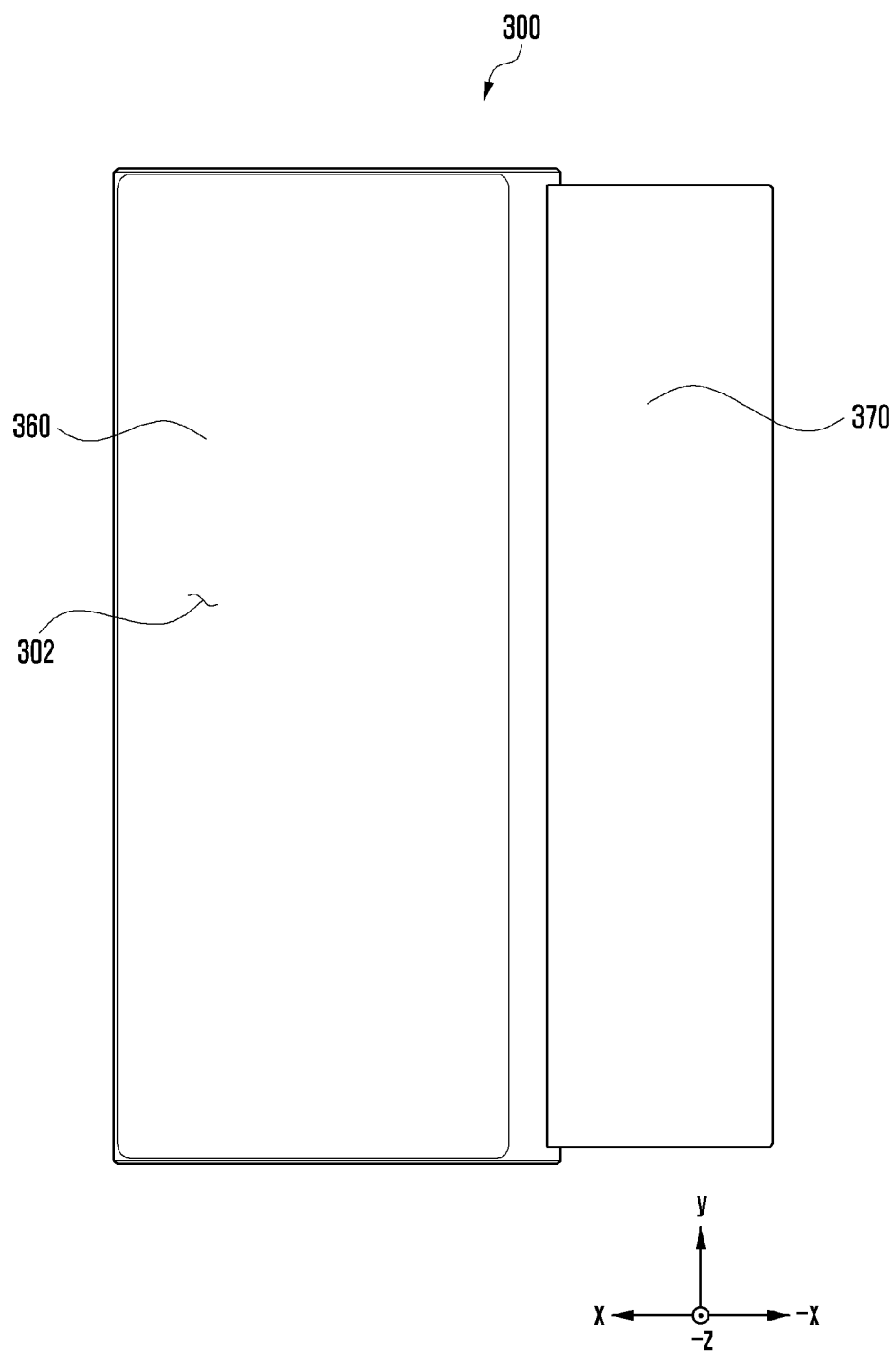
FIG. 5 is a view illustrating a rear surface (e.g., second surface) of an electronic device in a second state (e.g., open state) according to various embodiments of the disclosure.

FIG. 3 is a view illustrating a front surface (e.g., first surface) (e.g., surface on which a screen is displayed) of an electronic device in a first state (e.g., closed state) according to various embodiments of the disclosure. FIG. 4 is a view illustrating a front surface (e.g., first surface) (e.g., surface on which a screen is displayed) of an electronic device in a second state (e.g., open state) according to various embodiments of the disclosure. FIG. 5 is a view illustrating a rear surface (e.g., second surface) of an electronic device in a second state (e.g., open state) according to various embodiments of the disclosure.

The electronic device 300 of FIGS. 3 to 5 may be at least partly similar to the electronic device 101 of FIG. 1 or the electronic device 300 of FIG. 2, or may further include other embodiments of the electronic device.

Referring to FIGS. 3 to 5, the display 310 of the electronic device 300 according to various embodiments of the disclosure may include an expanded area 312 and a fixed area 314. In an open state (e.g., second state) of the electronic device 300 according to various embodiments of the disclosure, the fixed area 314 may be supported by an area of the bendable member (e.g., bendable member 620 of FIGS. 6 and 7). Further, in the open state (e.g., second state) of the electronic device 300, the expanded area 312 may be supported by another area of the bendable member (e.g., bendable member 620 of FIGS. 6 and 7). Accordingly, the fixed area 314 of the display 310 supported by the bendable member (e.g., bendable member 620 of FIGS. 6 and 7 may form a plane. Further, one part of the expanded area 312 of the display 310 may form a plane by a support plate (e.g., support plate 641 of FIG. 6), and another part thereof may form a curved surface by a curved area (e.g., sliding bar (e.g., pressing part 643) of FIG. 6) of the support plate (e.g., support plate 641 of FIG. 6).

Figure 6:
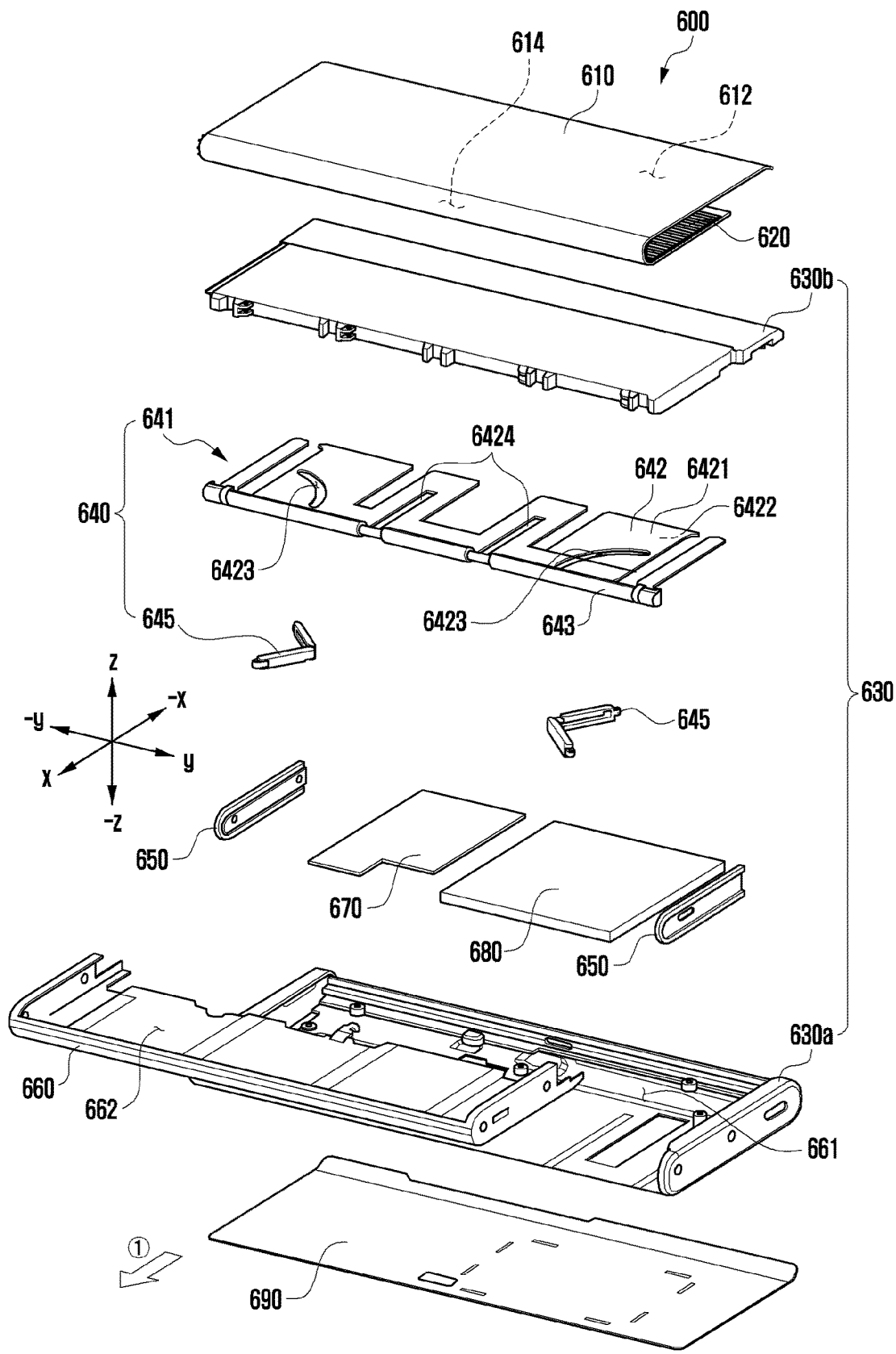
FIG. 6 is an exploded perspective view of an electronic device according to various embodiments of the disclosure.

As an example, in a closed state (e.g., first state) of the electronic device 300, at least a part of the bendable member (e.g., bendable member 620 of FIG. 6) may be accommodated inside the second housing 370 (e.g., second housing 660 of FIG. 6). The bendable member (e.g., bendable member 620 of FIG. 6) may enter a space between the support plate (e.g., support plate 641 of FIG. 6) and the second housing 370 (e.g., second housing 660 of FIG. 6) while supported by a sliding bar (e.g., pressing part 643 of FIG. 6) (e.g., sliding bar) of the electronic device 300. In this case, at least a partial area of the bendable member (e.g., bendable member 620 of FIGS. 6 and 7) may come in contact with a driving body (e.g., pressurized link 645 of FIG. 6).

In an embodiment, although not illustrated, an area, which substantially corresponds to the fixed area 314, of the bendable member (e.g., bendable member 620 of FIGS. 6 and 7) may be formed as the plate (e.g., support plate). In the closed state (e.g., first state), at least a part (e.g., bendable section or expanded area 312) of the display 310 may be disposed not to be seen from an outside by accommodated in an inner space of the second housing 370 (e.g., second housing 660 of FIG. 6) while supported by the bendable member (e.g., bendable member 620 of FIGS. 6 and 7).

According to an embodiment, in the open state (e.g., second state), at least a part (e.g., bendable section or expanded area 312) of the display 310 may be disposed to be seen from the outside while supported by the bendable member 620.

According to an embodiment, the electronic device 300 may include the front surface 301 on which the screen of the display 310 is displayed, the rear surface 302 directed in an opposite direction to the direction of the front surface 301, and the lateral surface 303 surrounding a space between the front surface 301 and the rear surface 302.

According to an embodiment, areas of the front surface 301 and the rear surface 302 of the electronic device 300 may be varied depending on the state (e.g., open state or closed state) of the electronic device 300. For example, in the open state (e.g., open state of FIG. 4) of the electronic device 300, the bendable section (e.g., expanded area 312) of the display 310 is drawn out, and thus the area (e.g., screen area) of the front surface 301 of the electronic device 300 may be widened. For example, in the closed state (e.g., closed state of FIG. 3) of the electronic device 300, the area of the rear surface 302 of the electronic device 300 may include the area of the back cover (e.g., back cover 330 of FIG. 2 or back cover 690 of FIG. 6) (e.g., rear cover). Further, in the open state of the electronic device 300, the area of the rear surface 302 of the electronic device 300 may include the area of the back cover (e.g., back cover 330 of FIG. 2 or back cover 690 of FIG. 6) (e.g., rear cover) and the area substantially corresponding to the bendable area on the rear surface of the second housing 370 (e.g., second housing 660 of FIG. 6).

According to an embodiment, the display 310 may include the fixed area 314 always visible to the outside, and the expanded area 312 visible to the outside in the open state (e.g., second state). The expanded area 312 may be visible to the outside only in the open state (e.g., second state) of the electronic device 300, and the fixed area 314 may be visible to the outside in the closed state (e.g., first state) and the open state (e.g., second state). For example, the expanded area 312 may extend from the fixed area 314, and may enter into or be drawn out from the fixed area 314 in accordance with the movement of the second housing 370 (e.g., second housing 660 of FIG. 6).

Figure 7:
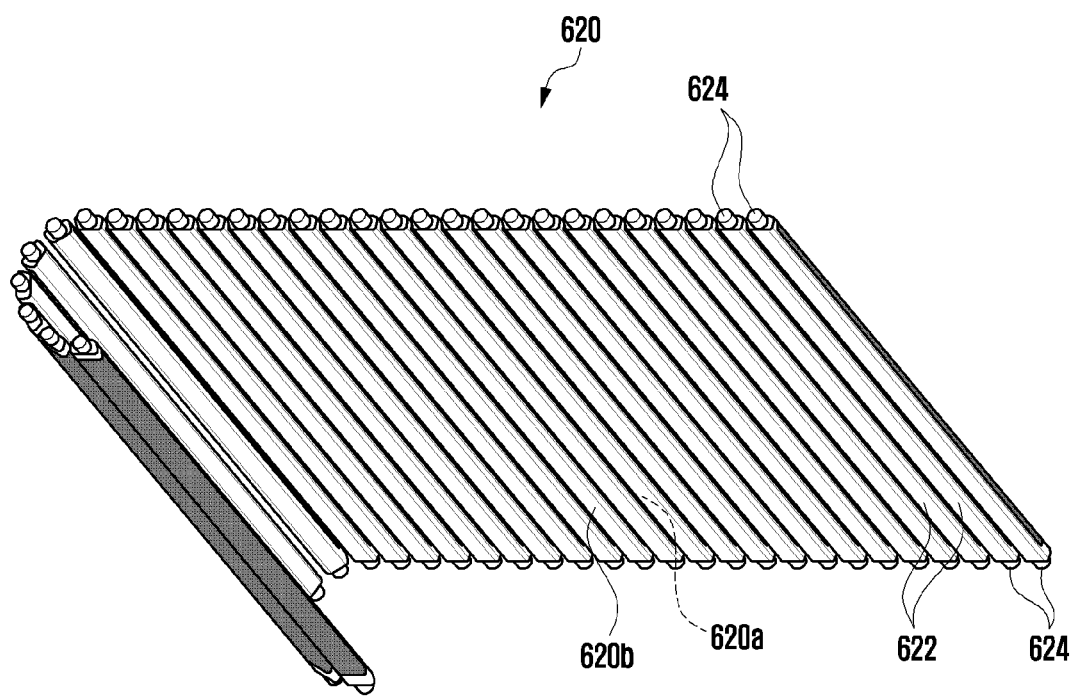
FIG. 7 is a view illustrating a bendable member according to various embodiments of the disclosure.

According to an embodiment, in the open state along the first direction (e.g., −x-axis direction), the expanded area 312 of the display 310 may extend while supported by the bendable member (e.g., bendable member 620 of FIGS. 6 and 7). In this case, at least parts of the fixed area 314 and the expanded area 312 may form substantially the same plane.

According to an embodiment, since the second housing 370 (e.g., second housing 660 of FIG. 6) and the support plate (e.g., support plate 641 of FIG. 6) of the electronic device 300 move in the first direction (e.g., −x-axis direction) or move in the second direction (e.g., x-axis direction) that is opposite to the first direction (e.g., −x-axis direction) in a sliding manner, the size (or area) of the display area of the display 310 can be varied.

According to an embodiment, the operation of the electronic device 300 in the closed state (e.g., first state) (e.g., screen expansion or slide-out) and/or the open state (e.g., second state) (e.g., screen reduction or slide-in) of the electronic device 300 may be manually performed through a user's operation.

According to an embodiment, the operation of the electronic device 300 in the closed state (e.g., first state) (e.g., screen expansion or slide-out) and/or the open state (e.g., second state) (e.g., screen reduction or slide-in) of the electronic device 300 may be automatically or semi-automatically performed using a driving device (e.g., motor, ball screw, cam, slider crank, or hinge).

FIG. 6 is an exploded perspective view of an electronic device according to various embodiments of the disclosure.

Referring to FIG. 6, an electronic device 600 (e.g., electronic device 300 of FIGS. 3 and 4) according to various embodiments of the disclosure may include a display 610 (e.g., display 310 of FIG. 2 or display 310 of FIGS. 3 and 4), a bendable member 620, a first housing 630, a support assembly 640, a guide rail 650, a second housing 660 (e.g., second housing 370 of FIGS. 3 and 4), a printed circuit board 670, a battery 680, and a back cover 690 (e.g., back glass) (e.g., rear cover).

In the electronic device 300 according to various embodiments of the disclosure, an inner space may be provided by the first housing 630 and the second housing 660, and the battery 680 (e.g., battery 189 of FIG. 1) and the printed circuit board 670 may be disposed in the inner space. On the printed circuit board 670, at least parts of the processor 120, the memory 130, the input module 150, the sound output module 155, the audio module 170, the sensor module 176, the interface 177, the connection terminal 178, the haptic module 179, the camera module 180, the power management module 188, and the communication module 190 as illustrated in FIG. 1, and/or other components of the electronic device 300 may be disposed.

According to an embodiment, the display 610 may be formed of a flexible material, be rollable, and display an image in accordance with an input image signal. The display 610 may include a first section 612 (e.g., fixed section 610a of FIG. 10) visually exposed to the outside in a reduced screen state (e.g., closed state), and a second section 614 (e.g., bendable section 610b of FIG. 10) visually exposed to the outside in an expanded screen state (e.g., open state).

According to an embodiment, in the electronic device 600, a first space 661 may be formed by the first housing 630, and a second space 662 may be formed by the second housing 660. The second housing 660 may be slidably combined with the first housing 630. The bendable member 620 may be at least partly rotatably disposed in the second space 662. The display 610 may be disposed so as to be supported by at least a part of the bendable member 620 and the first housing 630.

According to an embodiment, the first space 661 of the first housing 630 may be provided through a combination of a first bracket housing 630a and a second bracket housing 630b.

According to an embodiment, the electronic device 600 may include the printed circuit board 670 and the battery 680 disposed in the first space 661. The printed circuit board 670 and the battery 680 may be disposed adjacent to each other.

According to an embodiment, the electronic device 600 may include a camera module (e.g., camera module 305 of FIG. 3) and a sensor module (e.g., sensor module 307 of FIG. 3) disposed in the first space 661.

According to an embodiment, the bendable member 620 may be disposed so that one end thereof is fixed to the first housing 630, and the other end thereof is at least partly movably accommodated in the second space 662 of the second housing 660. For example, in an entrance state, the bendable member 620 may be at least partly accommodated in the second space 662. In a drawn-out state, the bendable member 620 may be at least partly drawn out of the second space 662 so as to form substantially the same plane with the first housing 630 (e.g., second bracket housing 630b). Accordingly, the display area, visible from the outside, of the display 610 supported by at least parts of the first housing 630 and the bendable member 620 may be varied in accordance with the sliding operation of the display 610.

According to an embodiment, the electronic device 600 may include at least one guide rail 650 disposed between the first housing 630 and the second housing 660 to guide the sliding operation of the second housing 660. In a certain embodiment, the electronic device 600 may further include a cover member (not illustrated) disposed to cover both lateral surfaces (e.g., third lateral surface 303c and fourth lateral surface 303d of FIGS. 2 and 3) of the first housing 630.

According to various embodiments, the electronic device 600 may include a support assembly 640. The support assembly 640 may be at least partly movably disposed from the first housing 630 in the first direction (e.g., x-axis direction of FIGS. 2 and 3), and may press the second housing 660 in the drawn-out direction.

According to an embodiment, the support assembly 640 may include the support plate 641 and at least one pressurized link 645. As an embodiment, the support plate 641 may be slidably combined with the first housing 630 (e.g., second bracket housing 630b). As an embodiment, the at least one pressurized link 645 may be disposed to be supported by the first housing 630 (e.g., second bracket housing 630b), and may press the support plate 641 in the drawn-out direction (e.g., x-axis direction of FIGS. 2 and 3).

As an embodiment, the at least one pressurized link 645 may include at least two unit links connected to be widened through an elastic member (e.g., torsion spring), and may provide a pressing force for pressing the support plate in the drawn-out direction (e.g., −x-axis direction) through the force for widening the unit links.

According to an embodiment, the support plate 641 may include a plate part 642 and a pressing part 643 (e.g., sliding bar). As an embodiment, the plate part 642 may be slidably combined with the first housing 630, and may include a first surface 6421 directed in a designated direction (e.g., z-axis direction) and a second surface 6422 directed in an opposite direction (e.g., −z-axis direction) to the first surface 6421. As an embodiment, the pressing part 643 (e.g., sliding bar) may extend to have substantially the same length as the length direction (e.g., y-axis direction of FIGS. 2 and 3) of the support plate 641 from an end part of the plate part 642.

According to an embodiment, the pressing part 643 may be formed as a shape minimizing a frictional force in order to press the rear surface of the bendable member 620. For example, an outer side of the pressing part 643 may be formed to be curved. In a certain embodiment, the pressing part 643 may be structurally combined with the plate part 642 as a separate constituent element. According to an embodiment, the plate part 642 may include a link guide 6423 formed to guide at least one pressurized link 645. According to an embodiment, the at least one pressurized link 645 may provide a pressing force for pressing the second housing 660 always in the drawn-out direction (direction ①). When operating, the at least one pressurized link 645 supports the bendable member 620, and thus can help reduction of a drooping phenomenon of the display 610. According to an embodiment, the support plate 641 is combined with the second housing 660, and thus can contribute to the forming of the second space 662. In a certain embodiment, the support plate 641 may be replaced by a part of the second housing 660.

According to various embodiments, the electronic device 600 may have an anti-loose structure for guiding the bendable member 620 to move in a manner that it comes in close contact with the first surface 6421 of the plate part 642 of the support plate 641. According to an embodiment, the anti-loose structure may be disposed through at least a part of the support assembly 640. According to an embodiment, the anti-loose structure may include at least one guide slit 6424 formed at designated intervals on the rear side of the bendable member 620.

According to an embodiment, the at least one guide slit 6424 may also be formed to have a length in accordance with the entrance direction and the drawn-out direction of the electronic device 600.

According to an embodiment, the bendable member 620 may include the plurality of multi-bars (e.g., the plurality of multi-bars 622 of FIG. 7) rotatably combined with one another.

According to various embodiments, at least a part of the display 610 may be fixed in a manner that it is attached to the bendable member 620 through taping, welding, or bonding. According to an embodiment, the bendable member 620, to which the at least a part of the display 610 is attached, may be disposed in a manner that it substantially comes in close contact with the first surface 6421 of the plate part 642 of the support plate 641 and the at least a part of the outer side of the pressing part 643. In the entrance state, the bendable member 620 may be accommodated in the second space 662 of the second housing 660 together with the display 610 in accordance with the sliding operation of the support plate 641.

Figure 8:
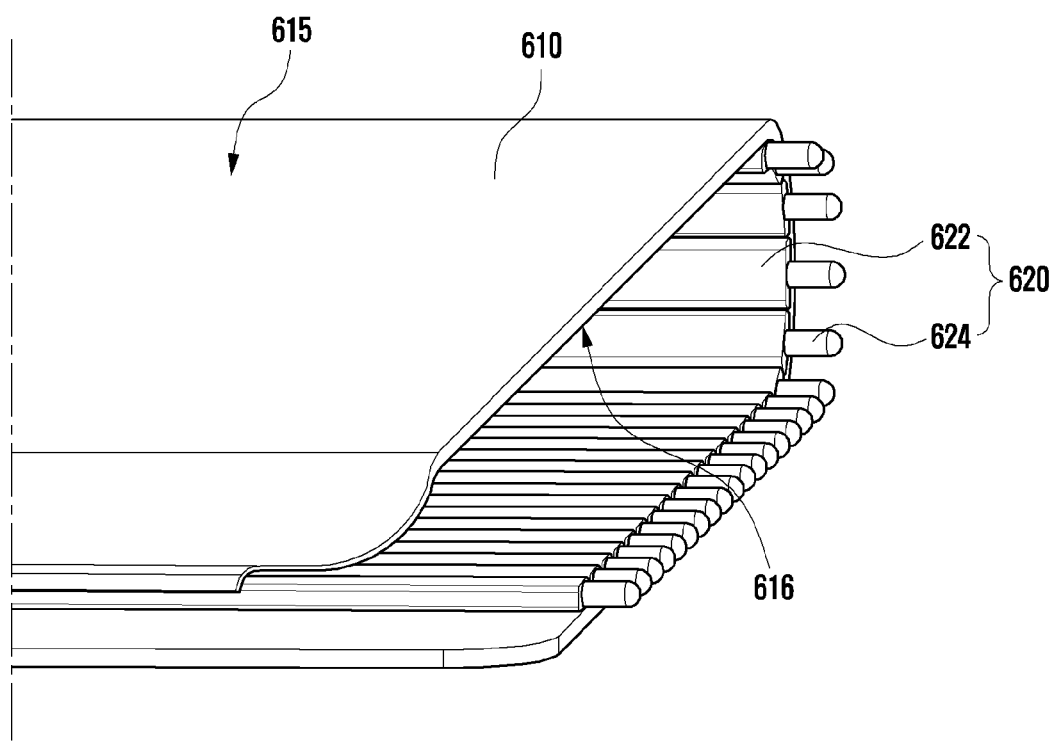
FIG. 8 is a view illustrating a display supported by a bendable member according to various embodiments of the disclosure.

FIG. 7 is a view illustrating a bendable member according to various embodiments of the disclosure. FIG. 8 is a view illustrating a display supported by a bendable member according to various embodiments of the disclosure.

Referring to FIGS. 6 to 8, according to an embodiment, the bendable member 620 may include the plurality of multi-bars 622 to perform a rolling operation of the display 610. The front surface 620a of the bendable member 620 may be adjacent to the display 610, and the rear surface 620b thereof may be adjacent to the first housing 630.

According to an embodiment, the front surface 615 of the display 610 may be directed in the y-axis (e.g., y axis of FIGS. 2 and 3) direction, and the rear surface 616 of the display 610 may be directed in the −y-axis (e.g., −y axis of FIGS. 2 and 3) direction. According to an embodiment, the bendable member 620 may be attached to the rear surface 616 of the display 610 by adhesives (e.g., thermal adhesive, photoreactive adhesive, general adhesive, and/or double-sided tape). The plurality of multi-bars 622 of the bendable member 620 may be disposed at predetermined intervals. The bendable member 620 may support the bendable section (e.g., bendable section 610b of FIG. 10) so that the bendable section maintains a smooth connection with the fixed section (of the display 610.

According to an embodiment, the plurality of multi-bars 622 may be formed of a metal material and/or polymer. Each of the plurality of multi-bars 622 may include guide protrusions 624 formed to protrude at both ends of the multi-bar so as to be guided along the guide rail 650 in the inner space of the electronic device 600.

According to an embodiment, a portion or all of the plurality of multi-bars 622 may include at least one friction reduction area (e.g., POM layer, acetal layer, and teflon layer) in order to reduce friction. For example, an area that comes in contact (or friction) with at least one of the multi-bars 622 may include the friction reduction area.

According to an embodiment, although not illustrated, a bending plate (e.g., bending plate 1320 of FIG. 13) may be disposed on the bendable member 620. For example, the bending plate (e.g., bending plate 1320 of FIG. 13) may connect the plurality of bars with one another so as to support the fixed section (e.g., fixed section 610a of FIG. 10).

According to an embodiment, the support assembly 640 may expand or reduce the screen of the display 610 by performing a sliding movement in the −x-axis direction and x-axis direction in accordance with the movement of the second housing 660. For example, the support assembly 640 may expand a visible size of the screen of the display 610 by pushing the bendable member 620 in the x-axis direction. Alternatively, when the second housing 660 moves in the −x-axis direction by an external force, the support assembly 640 may reduce a visible size of the screen of the display 610 by pushing the bendable member 620 in the −x-axis direction. The support assembly 640 may support at least a part of the bendable member 620 on the bending part (e.g., bending part 601 of FIG. 10) on which the display 610 is bent. Alternatively, when the screen of the display 610 is extended, the support assembly 640 may support the bendable member 620 on a flat area (e.g., flat area 602 of FIG. 10) excluding the bending part (e.g., bending part 601 of FIG. 10).

Figure 9:
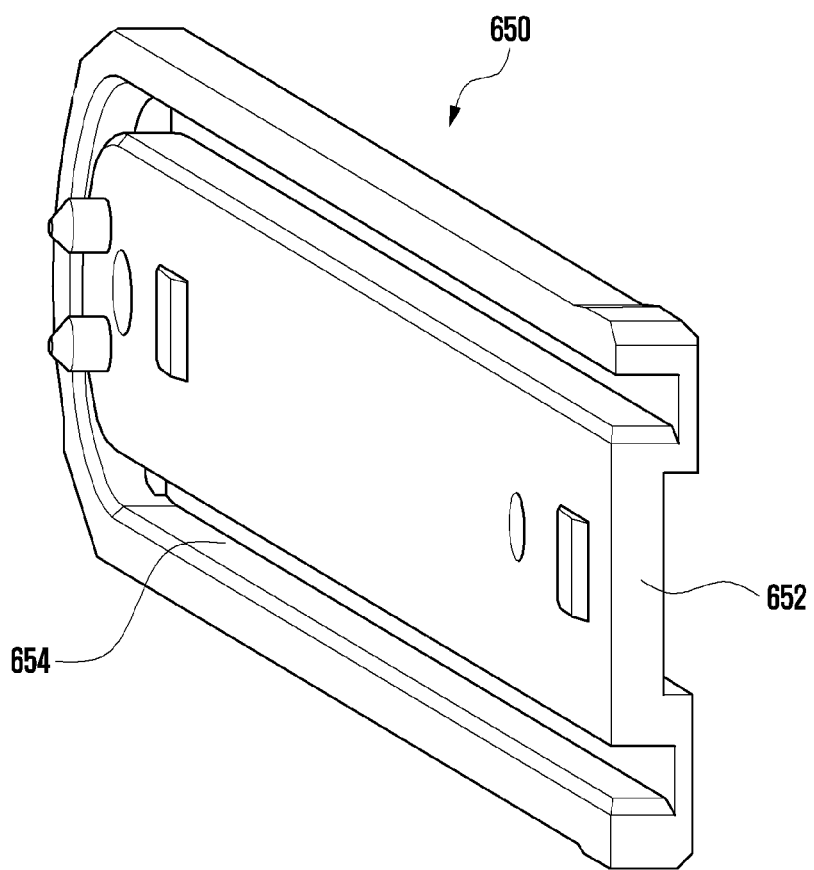
FIG. 9 is a view illustrating a guide rail according to various embodiments of the disclosure.

FIG. 9 is a view illustrating a guide rail according to various embodiments of the disclosure.

With reference to FIGS. 6, 8, and 9, the guide rail 650 may include a side body 652 forming at least one side of the electronic device 600 and a guide groove 654 guiding the movement of the bendable member 620 in a state where the display 610 and/or at least a part (e.g., guide protrusion 624)

of the bendable member 620 are inserted therein. The guide rail 650 may provide a path in which the display 610 and/or the bendable member 620 move through the guide groove 654. For example, the guide rail 650 may be disposed inside the second housing 660 in the y-axis direction and in the −y-axis direction. Since the bendable section (e.g., bendable section 610b of FIG. 10) of the display 610 enters or is drawn out of the second housing 660 along the guide rail 650, the display 610 may enter or be drawn out in a manner that the display 610 is smoothly connected to the lateral side of the second housing 660.

As an embodiment, the first housing 630 may accommodate at least a part of the second housing 660, may be combined with the second housing 660, may protect electronic components disposed inside the electronic device 600, and may form an exterior of the electronic device 600.

According to an embodiment, during the movement in order to extend the screen of the display 610, the second housing 660 may slide in the first direction (e.g., x-axis direction of FIGS. 2 and 3). According to an embodiment, during the movement in order to reduce the screen of the display 610, the second housing 660 may slide in the second direction (e.g., −x-axis direction of FIGS. 2 and 3).

According to an embodiment, the back cover 690 (e.g., back glass) may be located on a lower part of the first housing 630, and may be an exterior case of the electronic device 600. The back cover 690 may be formed of polymer, coated or colored glass, ceramic, metal (e.g., aluminum, stainless steel (STS), or magnesium), or a combination of at least two of the above materials.

Figure 10:
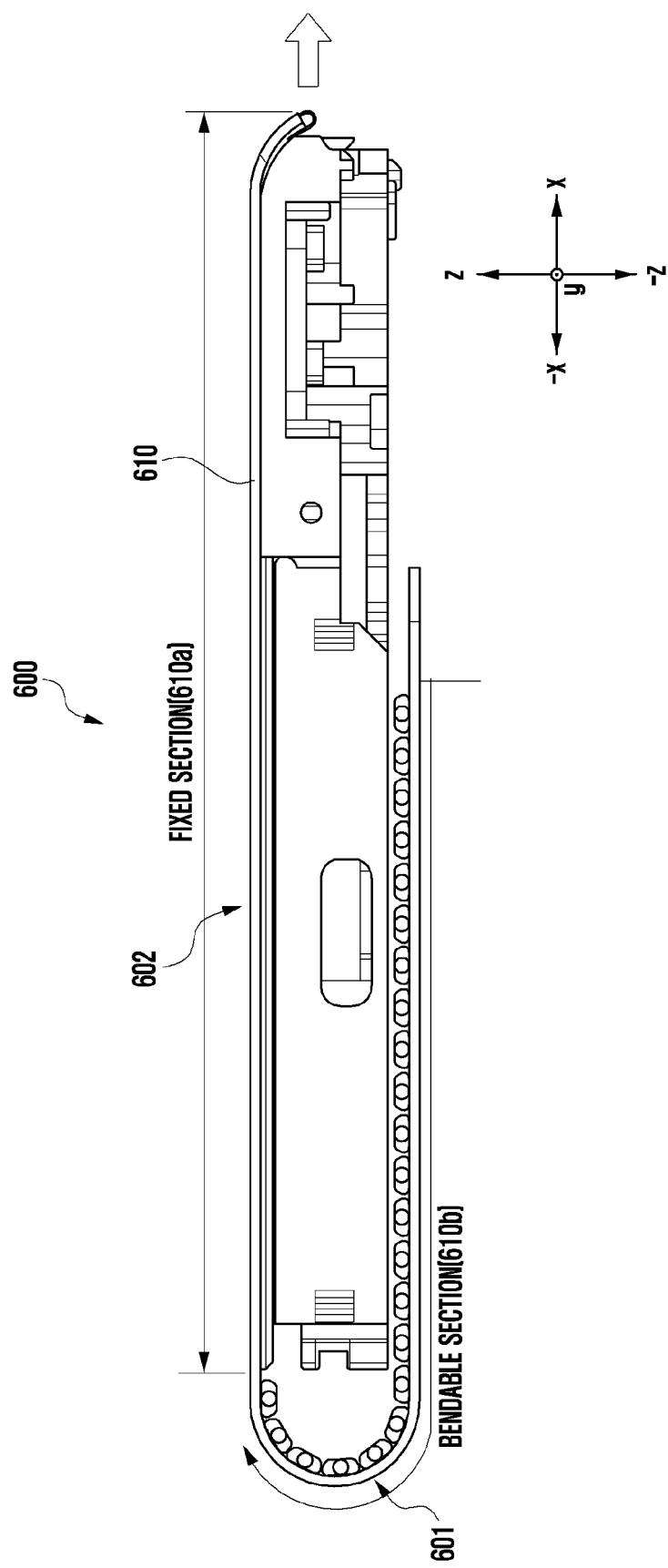
FIG. 10 is a view illustrating a fixed section and a bendable section of a display according to various embodiments of the disclosure.
Figure 11:
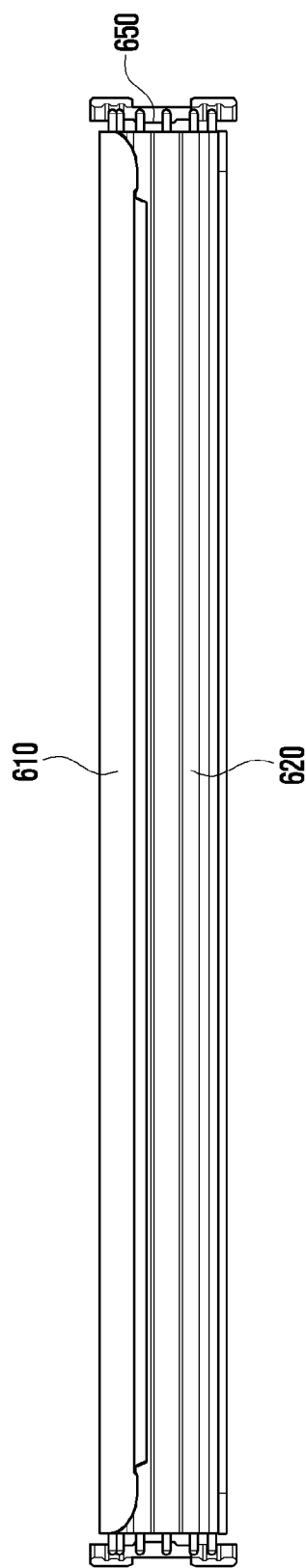
FIGS. 11 and 12 are views illustrating a display supported by a bendable member according to various embodiments of the disclosure.
Figure 12:
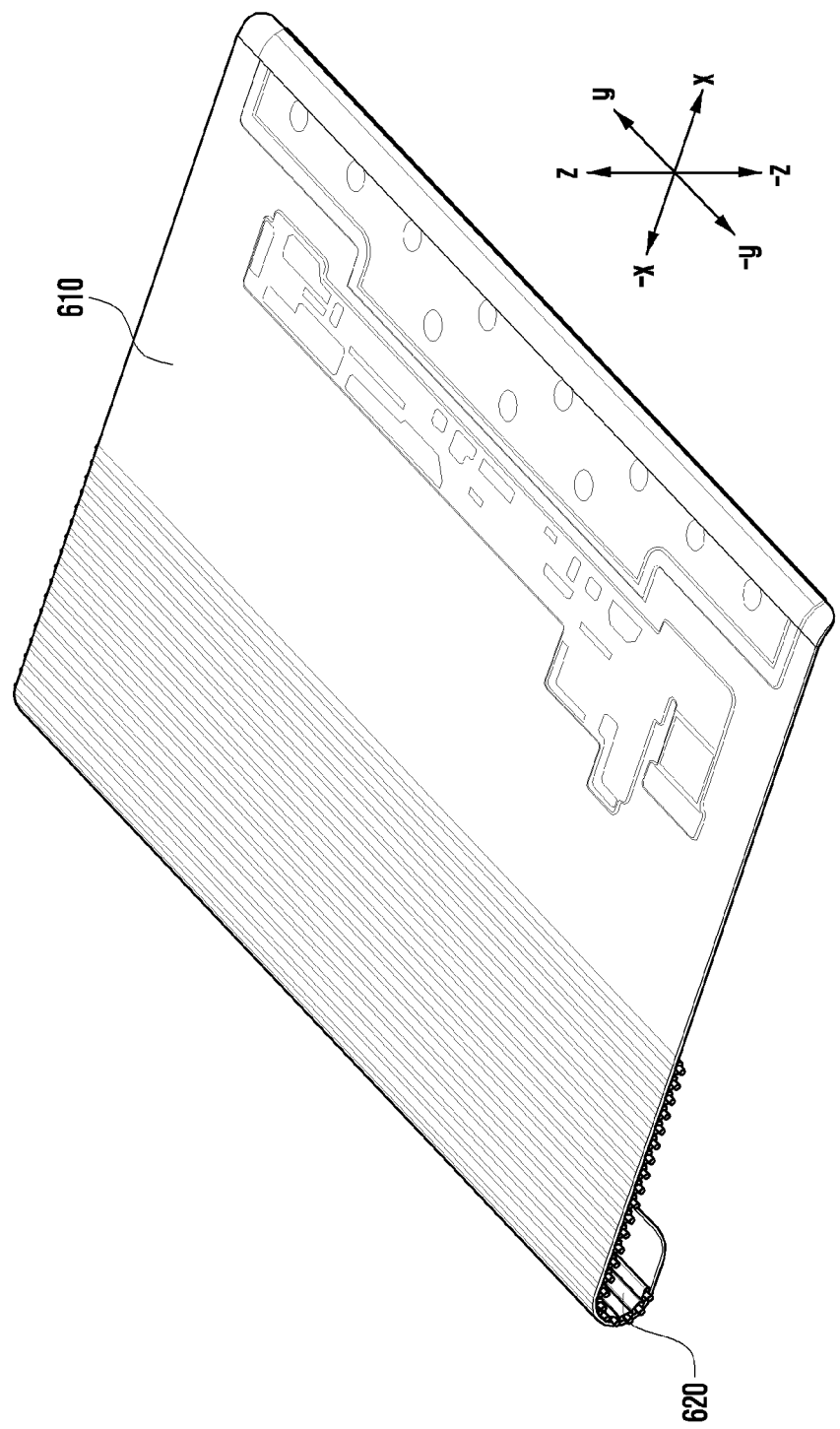

FIG. 10 is a view illustrating a fixed section and a bendable section of a display according to various embodiments of the disclosure. FIGS. 11 and 12 are views illustrating a display supported by a bendable member according to various embodiments of the disclosure.

Referring to FIGS. 10 to 12, since the movement of the bendable member 620 is guided by the guide rail 650, the bendable member 620 may move in the x-axis direction and −x-axis direction. The display 610 attached to the bendable member 620 may be extended or retracted by the movement of the bendable member 620.

According to various embodiments of the disclosure, in the first state (e.g., closed state) of the electronic device 600, only the fixed section 610a of the display 610 may be visually exposed to the outside. In the second state (e.g., open state) of the electronic device 600, the bendable section 610b of the display 610 may move in the x-axis direction via the bending part 601, and thus the fixed section 610a and the bendable section 610b may be visually exposed to the outside. Since the plurality of multi-bars (e.g., multi-bars 622 of FIG. 8) of the bendable member 620 support the display 610 in the bendable section 610b and at least a part of the fixed section 610a, it can be reduced that the display 610 gets loose in the z-axis direction, or droops in the −z-axis direction.

Figure 13:
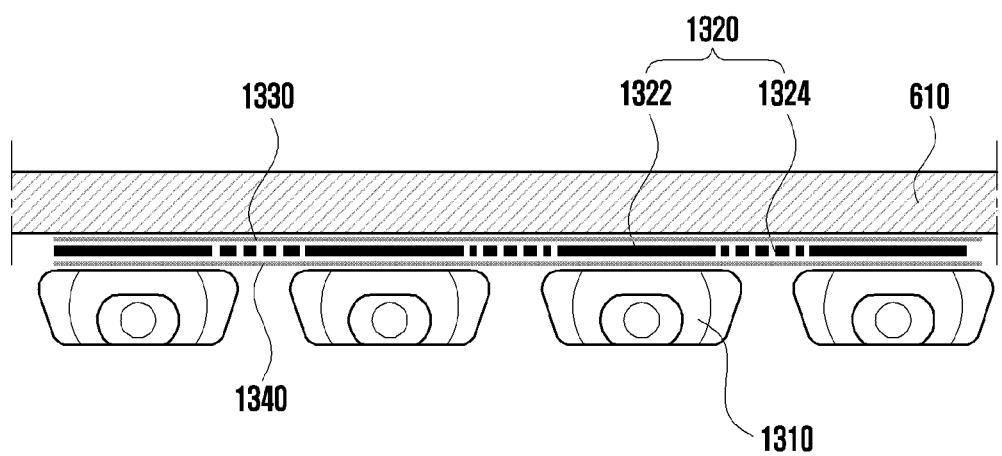
FIG. 13 is a view illustrating a bending plate disposed between a display and multi-bars of a bendable member according to various embodiments of the disclosure.
Figure 14:
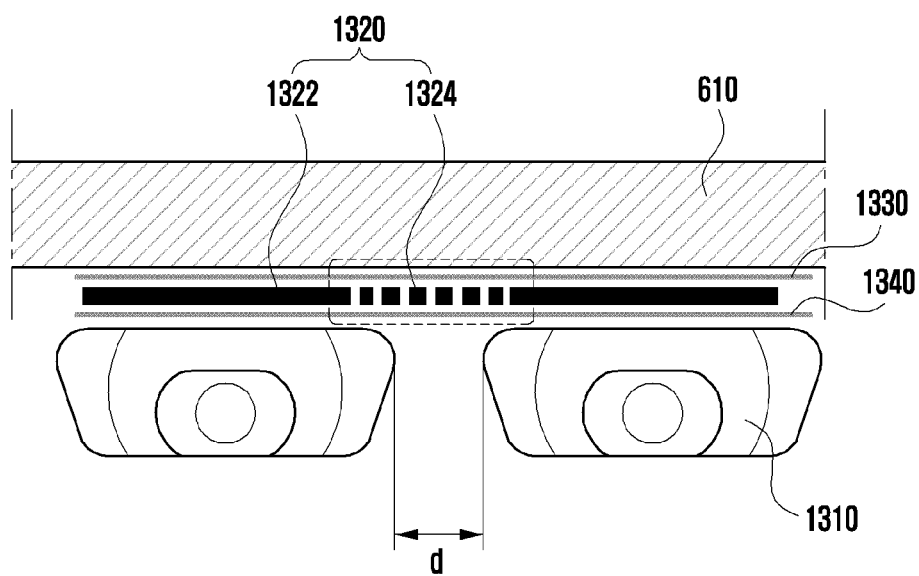
FIG. 14 is a view illustrating a bending plate according to various embodiments of the disclosure.

FIG. 13 is a view illustrating a bending plate 1320 disposed between a display 610 and multi-bars 1310 of a bendable member according to various embodiments of the disclosure. FIG. 14 is a view illustrating a bending plate according to various embodiments of the disclosure.

With reference to FIGS. 13 and 14, the bending plate 1320 may be disposed between the display 610 and the multi-bars 1310 of the bendable member.

According to an embodiment, the bending plate 1320 may be disposed in the bendable section (e.g., bendable section 610b of FIG. 10) disposed to be seen from the outside in a slide-out state on the lower part of the display 610.

According to an embodiment, the upper surface of the bending plate 1320 may be attached to the lower surface of the display 610 through the first adhesive member 1330 (e.g., first adhesive tape). As an example, the first adhesive member 1330 may be attached to the entire upper surface of the bending plate 1320. The lower surface of the bending plate 1320 may be attached to the upper surface (e.g., upper surface 1311 of FIG. 15A) of the multi-bar 1310 through a separate second adhesive member (e.g., second adhesive tape). As an example, the second adhesive member 1340 may be attached to the entire lower side of the bending plate 1320.

According to an embodiment, the lower surface of the bending plate 1320 may be attached to the upper surface (e.g., upper surface 1311 of FFIG. 15A) of the multi-bar 1310 through welding. According to an embodiment, the lower surface of the bending plate 1320 may be attached to the upper surface (e.g., upper surface 1311 of FIG. 15A) of the multi-bar 1310 through bonding.

According to an embodiment, the bending plate 1320 may be formed of a metal material or a rubber (e.g., urethane or liquid silicone rubbers (LSR)) material. However, the bending plate 1320 is not limited thereto, but may be formed of a material which is flexibly deformed against the compressive force and the tensile stress, and has a small change of thickness when the compressive force and the tensile stress are applied thereto.

According to an embodiment, the bending plate 1320 may include a reduction section 1324 (e.g., interlocking section) located to correspond to an interval d formed between the support plate 1322 located to correspond to the upper side of the multi-bars 1310 and the multi-bars 1310. The reduction section 1324 may be formed in at least a part of the support plate 1322 with uniform cuts. While the bendable section (e.g., bendable section 610b of FIG. 10) of the display 610 moves in the x-axis direction via the bending part 601, the compressive force is applied thereto, and the interval d between the multi-bars 1310 becomes narrower. If the interval d between the multi-bars 1310 becomes narrower, interference may occur between the multi-bars 1310, and local tensile stress may occur in the section between the multi-bars 1310. Since the bendable member is flexibly bent by the reduction section 1324, occurrence of the interference between the multi-bars 1310 can be reduced by the compressive force and the tensile stress, and it can be reduced that the bending plate 1320 gets loose. As an example, if the bending plate 1320 is not disposed between the display 610 and the plurality of multi-bars 1310, the interval between the multi-bars 1310 becomes narrower on the bending part, and due to this, the compressive force is applied to the display 610, and at least a part of the display 610 may get loose. Since the bending plate 1320 including the support plate 1322 and the reduction section 1324 (e.g., interlocking section) is disposed between the plurality of multi-bars 1310, the compressive force that may be applied to the display 610 can be reduced even if the interval between the multi-bars 1310 becomes narrower on the bending part, and thus defects, such as getting loose or deformation of the display 610, can be prevented from occurring.

Figure 15A:
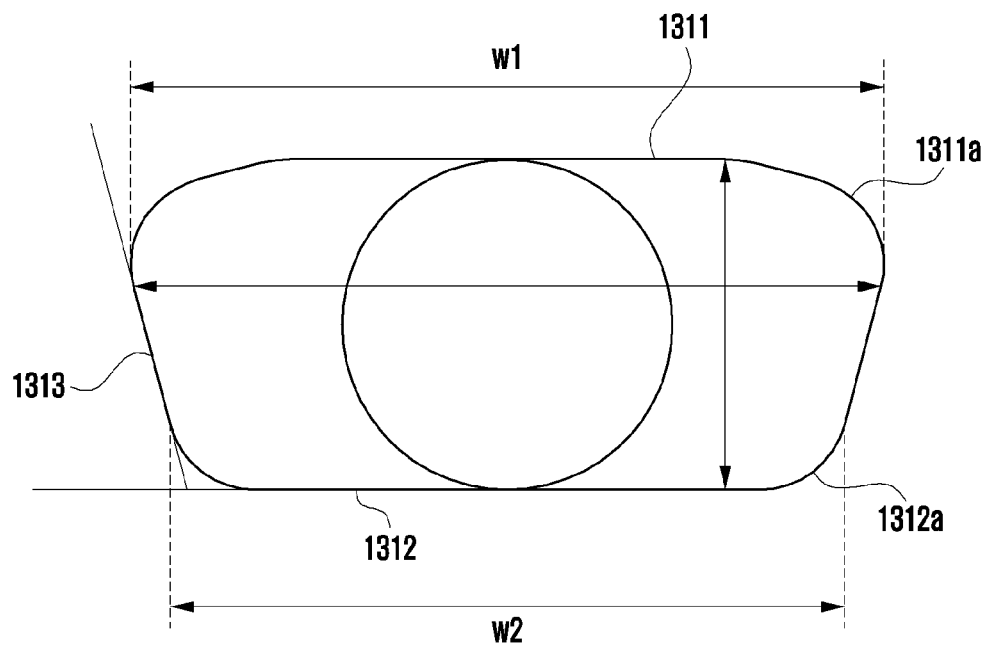
FIG. 15A is a view illustrating a multi-bar of a bendable member according to various embodiments of the disclosure.
Figure 15B:
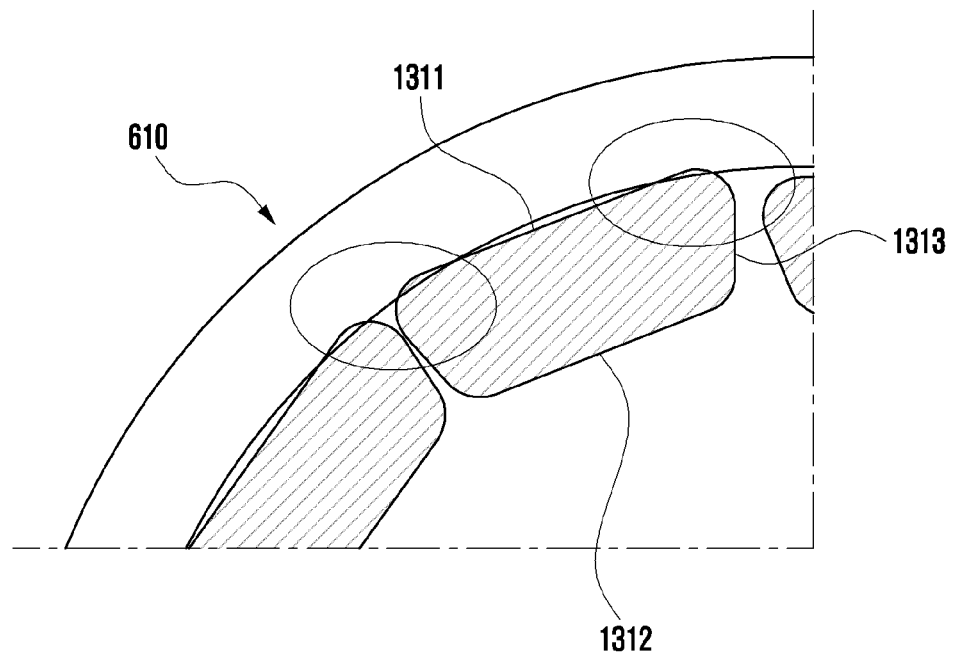
FIG. 15B is a view explaining avoidance of an interference between multi-bars during movement thereof on a curved surface of a bendable member.
Figure 15C:
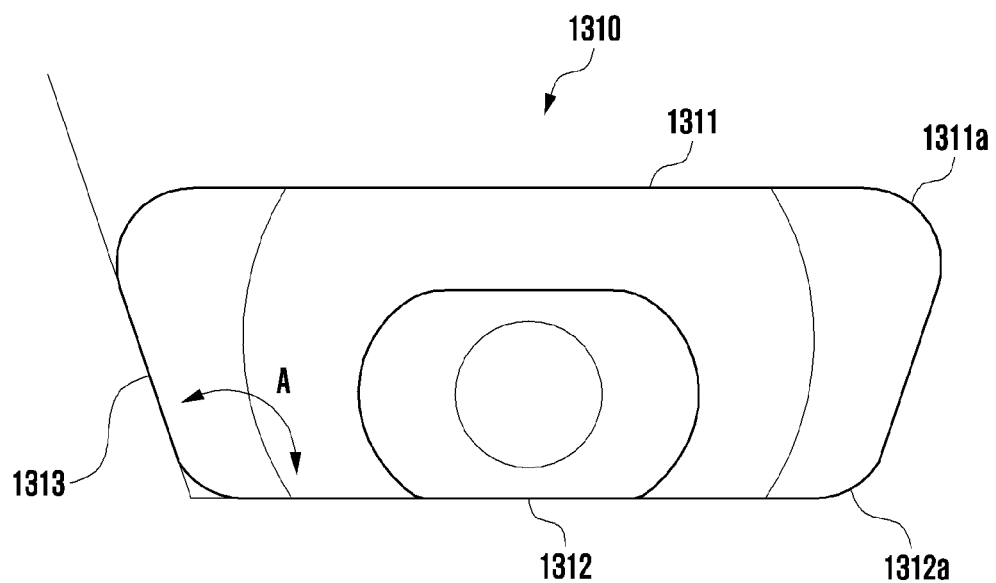
FIG. 15C is a view illustrating a shape of a multi-bar for avoiding an interference between multi-bars during movement thereof on a curved surface of a bendable member.

FIG. 15A is a view illustrating a multi-bar of a bendable member according to various embodiments of the disclosure. FIG. 15B is a view explaining avoidance of an interference between multi-bars during movement thereof on a curved surface of a bendable member. FIG. 15C is a view illustrating a shape of a multi-bar for avoiding an interference between multi-bars during movement thereof on a curved surface of a bendable member.

Referring to FIGS. 15A to 15C, the multi-bars 1310 may be disposed at predetermined intervals (e.g., interval d of FIG. 14) so that the interference between the multi-bars 1310 does not occur in the bendable section (e.g., bendable section 610b of FIG. 10) of the display 610. In embodiments that the predetermined interval d is formed between the multi-bars 1310, the display 610 can implement a shape of a curved surface in the bendable section (e.g., bendable section 610b of FIG. 10).

According to an embodiment, since the compressive force and the tensile stress may be applied to the part where the predetermined interval d is between the multi-bars 1310, the reduction section (e.g., reduction section 1324 of FIGS. 13 and 14) of the bending plate (e.g., bending plate 1320 of FIG. 14) may be disposed so as to correspond to the interval d. The interval between the multi-bars 1310 becomes narrower in the bendable section (e.g., bendable section 610b of FIG. 10), and thus the compressive force that may be applied to the display 610 can be reduced by the reduction section (e.g., interlocking section) (e.g., reduction section 1324 of FIGS. 13 and 14).

According to an embodiment, in order to implement the shape of the curved surface of the display 610 in the bendable section (e.g., bendable section 610b of FIG. 10), the multi-bar 1310 may be formed so that the upper surface 1311 thereof has a first width w1 and the lower surface 1312 thereof has a second width w2 that is different from the first width w1. The first width w1 of the upper side of the multi-bar 1310 may be formed to be wider than the second width w2. A lateral side 1313 may be disposed between the upper surface 1311 and the lower surface 1312 of the multi-bar 1310, and the lateral surface 1313 may be formed to be inclined at a predetermined angle A. As an example, the lateral surface 1313 may be formed to have an angle of 100° to 110° so that the upper surface 1311 becomes wider than the lower surface 1312.

According to an embodiment, during the curved motion of the multi-bars 1310, the corner 1311a of the upper surface 1311 of the multi-bar 1310 may be formed to have a predetermined curvature (e.g., 0.2R) (e.g., rounding shape) in order to avoid or reduce the interference between the multi-bars 1310. Further, the corner 1312a of the lower surface 1312 of the multi-bar 1310 may also be formed to have the predetermined curvature (e.g., 0.2R) (e.g., rounding shape).

Figure 16:
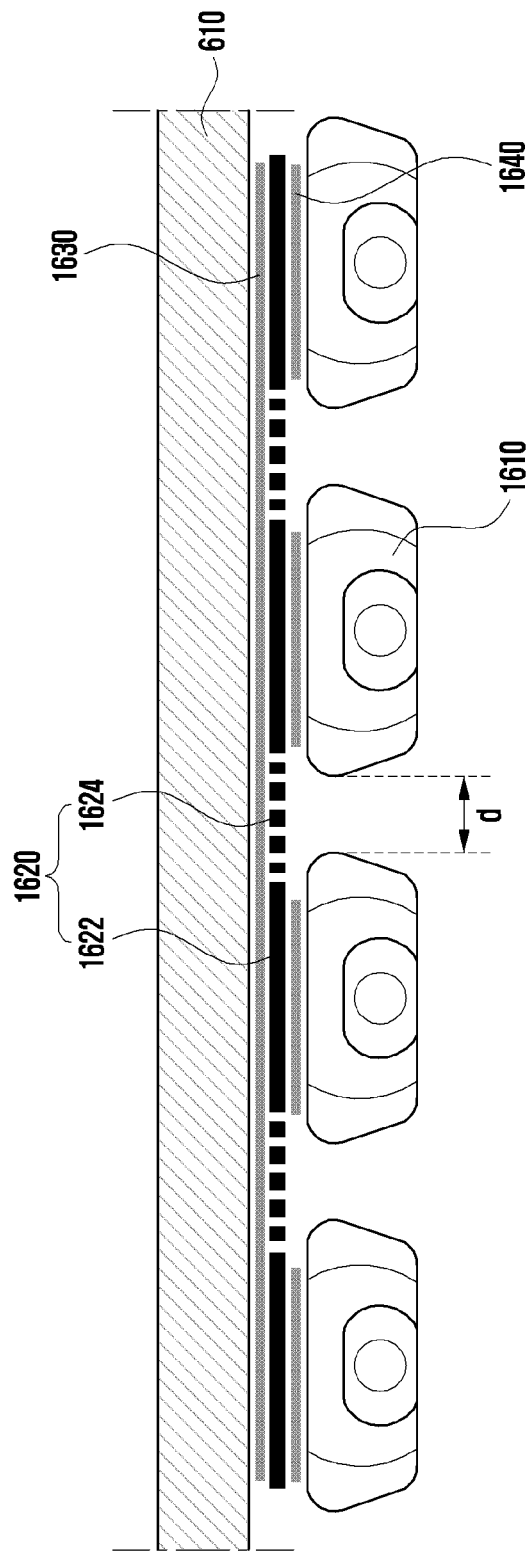
FIG. 16 is a view illustrating a bending plate disposed between a display and a bendable member according to various embodiments of the disclosure.
Figure 17A:
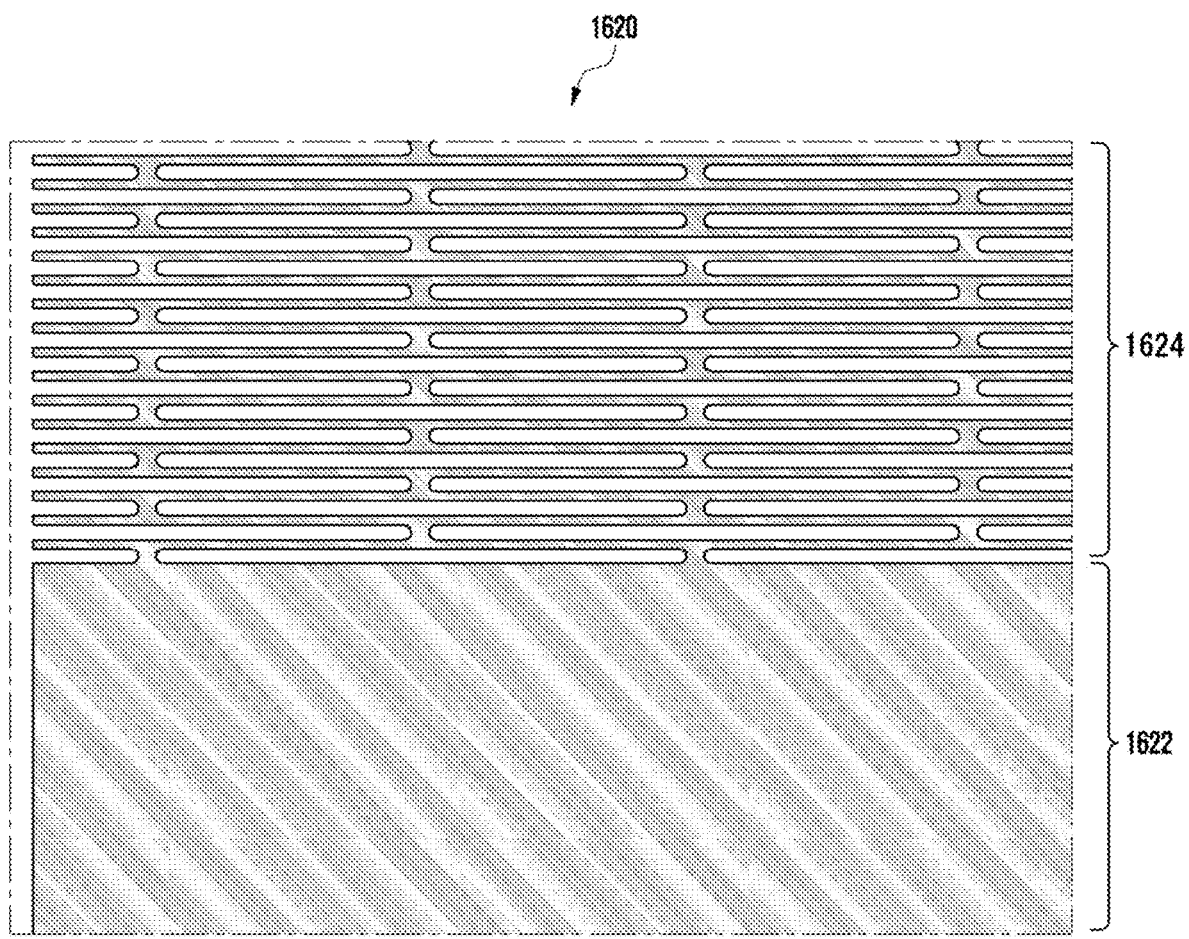
FIG. 17A is a view illustrating a form of a bending plate according to various embodiments of the disclosure.
Figure 17B:
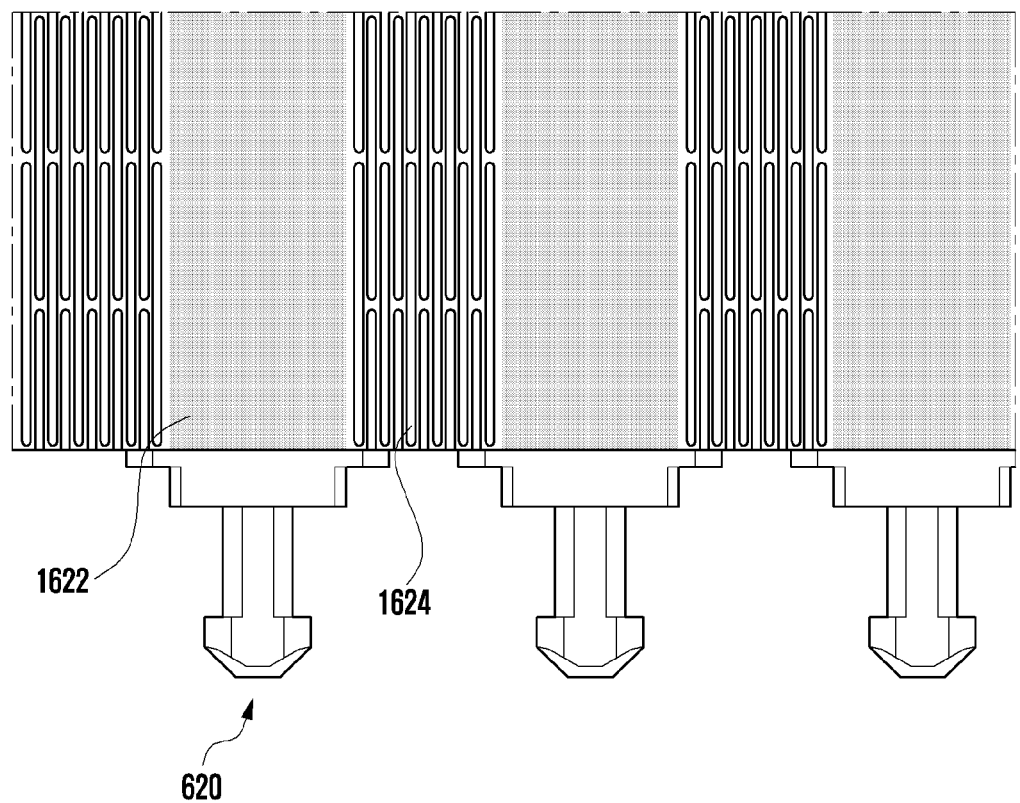
FIG. 17B is a view explaining bonding of multi-bars onto a lower part of a bending plate.
Figure 17C:
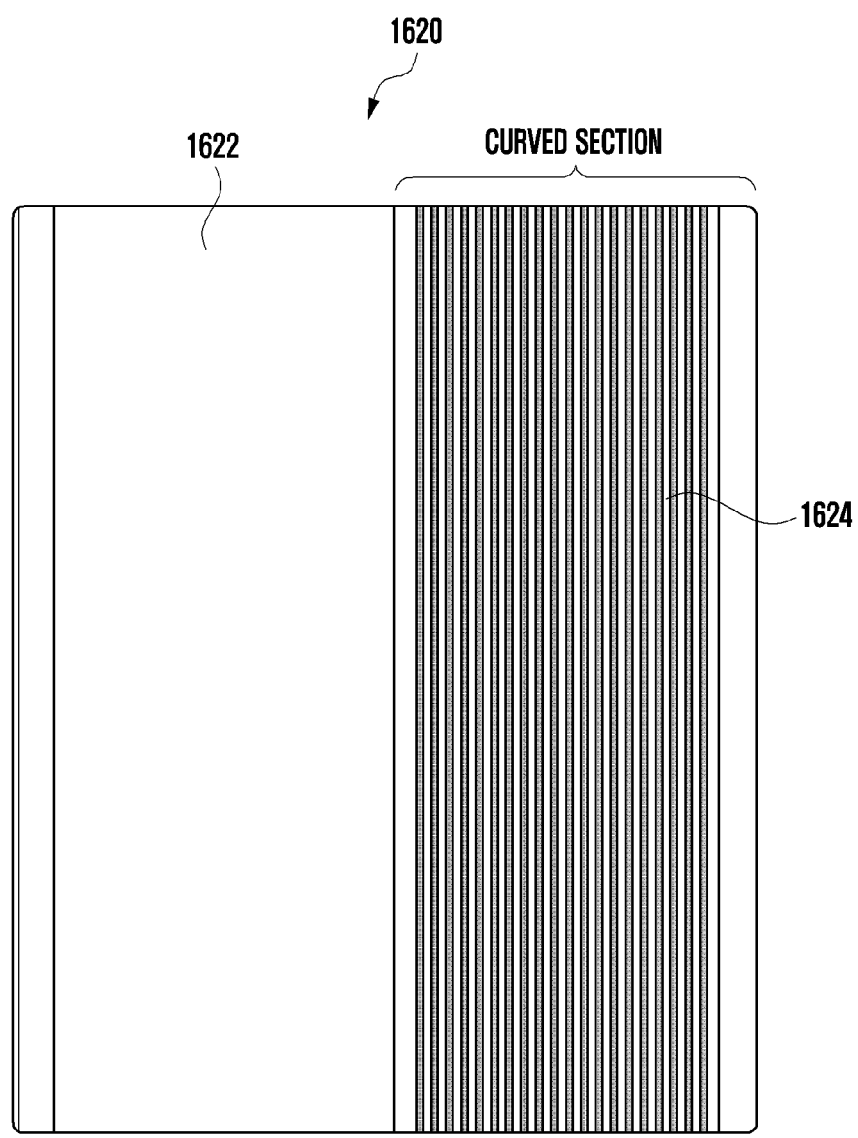
FIG. 17C is a view illustrating a support plate and an expansion section of a bending plate.

FIG. 16 is a view illustrating a bending plate disposed between a display and a bendable member according to various embodiments of the disclosure. FIG. 17A is a view illustrating a form of a bending plate according to various embodiments of the disclosure. FIG. 17B is a view explaining bonding of multi-bars onto a lower part of a bending plate. FIG. 17C is a view illustrating a support plate and an expansion section of a bending plate.

Referring to FIGS. 16 to 17C, a bending plate 1620 may be disposed between multi-bars 1610 of a bendable member (e.g., bendable member 620 of FIG. 8) and the display 610. A support plate 1622 of the bending plate 1620 may be disposed between the upper side of the multi-bar 1610 and the display 610. A reduction section 1624 (e.g., interlocking section) of the bending plate 1620 may be disposed to correspond to the interval d between the multi-bars 1610. As an example, the reduction section may be disposed to at least overlap a support plate 1622 of the bending plate 1620 of the multi-bars 1610 (e.g., to be disposed up and down based on the z-axis direction of FIGS. 2, 3, and 6 and to overlap the support plate. At least a part of the multi-bars 1610 may be disposed to overlap at least a part of the reduction section 1624 of the bending plate 1620. As an example, since the interval between the multi-bars 1310 becomes narrower in the bending part (e.g., bending part 601 of FIG. 10) to form the bend, the bendable member (e.g., bendable member 620 of FIG. 8) and the display 610 may be flexibly bent to form a curved surface section in the bendable section (e.g., bendable section 610b of FIG. 10) by the reduction section 1624 of the bending plate 1620.

According to an embodiment, a first adhesive member 1630 (e.g., adhesive tape) may be disposed on the upper surface of the bending plate 1620. The first adhesive member 1630 may be disposed on the entire upper surface of the bending plate 1620. The bending plate 1620 may be attached to the lower surface of the display 610 by the first adhesive member 1630. As an example, the first adhesive member 1630 may be attached to the entire upper surface of the bending plate 1620.

According to an embodiment, a plurality of second adhesive members 1640 (e.g., adhesive tape) may be disposed on the lower side of the bending plate 1620. The plurality of second adhesive members 1640 may be disposed on a part (e.g., part corresponding to the upper side of the multi-bars 1610) corresponding to the support plate 1622 on the lower side of the bending plate 1620. The bending plate 1620 may be attached to the upper side of the multi-bars 1610 by the second adhesive member 1640.

Figure 18A:
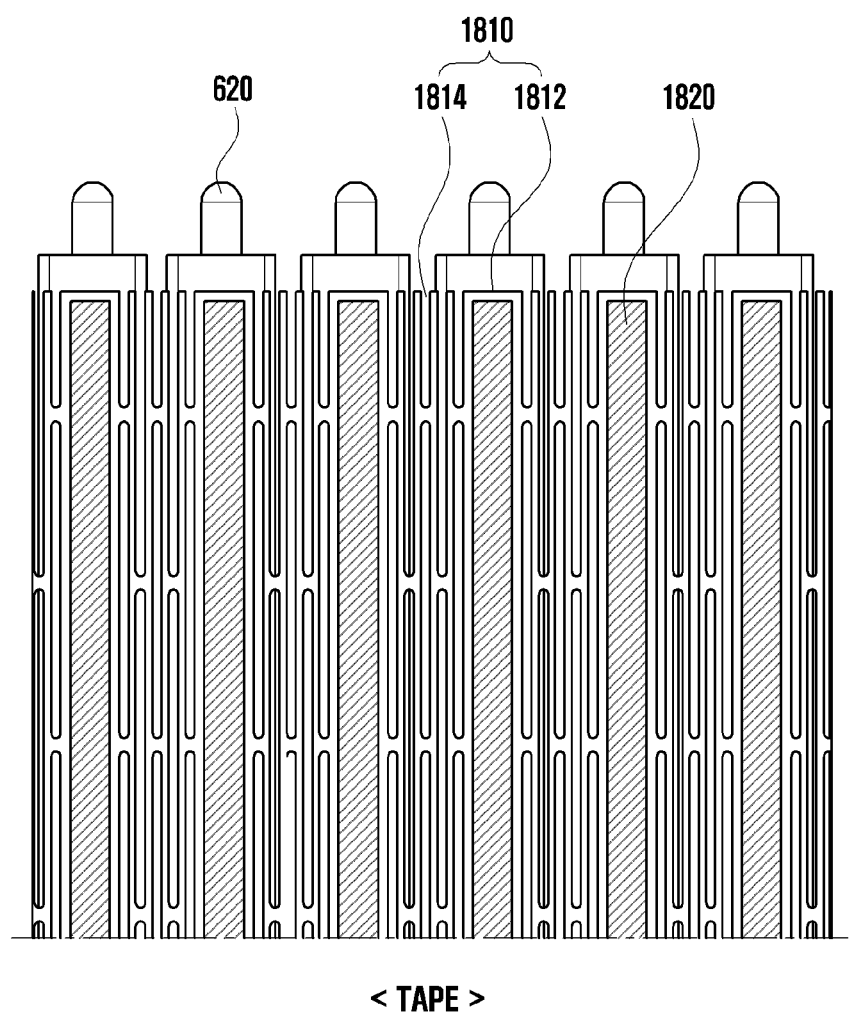
FIG. 18A is a view illustrating a bendable member and a bending plate attached to each other by taping.
Figure 18B:
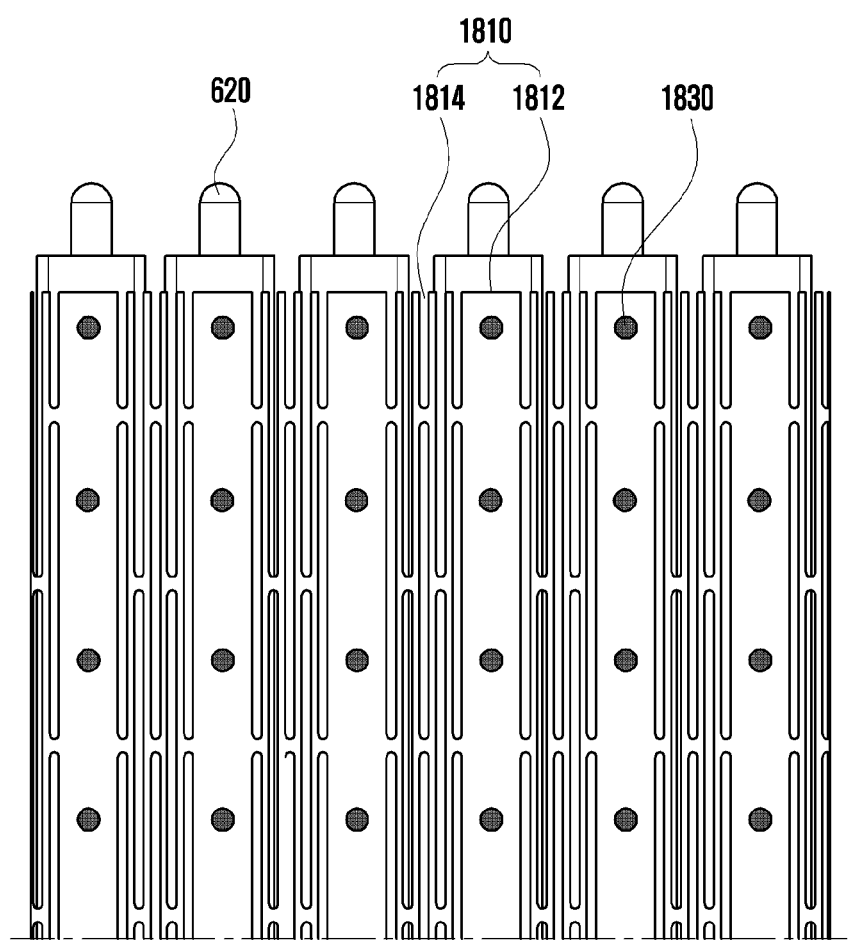
FIG. 18B is a view illustrating a bendable member and a bending plate attached to each other by welding.
Figure 18C:
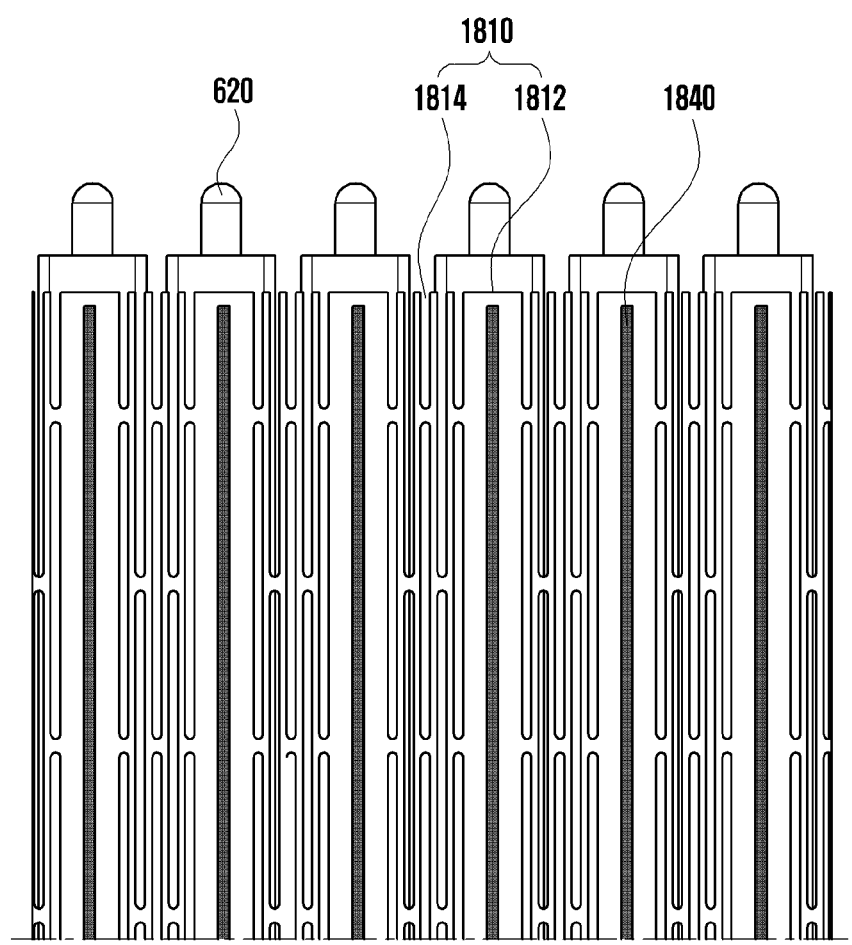
FIG. 18C is a view illustrating a bendable member and a bending plate attached to each other by bonding.

FIG. 18A is a view illustrating a bendable member and a bending plate attached to each other by taping. FIG. 18B is a view illustrating a bendable member and a bending plate attached to each other by welding. FIG. 18C is a view illustrating a bendable member and a bending plate attached to each other by bonding.

Referring to FIG. 18A, the bending plate 1810 may include a support plate 1812 and a reduction section 1814. The bending plate 1810 may be attached to the upper side of the bendable member 620. As an embodiment, the bending plate 1810 may be attached to the upper side of the multi-bars of the bendable member 620 by taping using an adhesive tape 1820 (e.g., double-sided adhesive tape) (e.g., second adhesive member 1340 of FIG. 13 or the plurality of second adhesive members 1640 of FIG. 16). The adhesive tape 1820 (e.g., double-sided adhesive tape) (e.g., second adhesive member 1340 of FIG. 13 or the plurality of second adhesive members 1640 of FIG. 16) may be disposed on the part overlapping the multi-bars of the bendable member 620 (e.g., may be disposed up and down based on the z-axis direction of FIGS. 2, 3, and 6 to overlap the multi-bars).

Referring to FIG. 18B, the bending plate 1810 may include the support plate 1812 and the reduction section 1814. The bending plate 1810 may be attached to the upper side of the bendable member 620. As an embodiment, the bending plate 1810 may be attached to the upper side of the multi-bars of the bendable member 620 by welding. The bendable member 620 and the bending plate 1810 may be attached to each other by forming a plurality of welding points 1830 between the multi-bars and the support plate 1812.

Referring to FIG. 18C, the bending plate 1810 may include the support plate 1812 and the reduction section 1814. The bending plate 1810 may be attached to the upper surface of the bendable member 620. As an embodiment, the bending plate 1810 may be attached to the upper surface of the multi-bars of the bendable member 620 by bonding. The bendable member 620 and the bending plate 1810 may be attached to each other by forming a plurality of bonding areas 1840 between the multi-bars and the support plate 1812.

Figure 19:
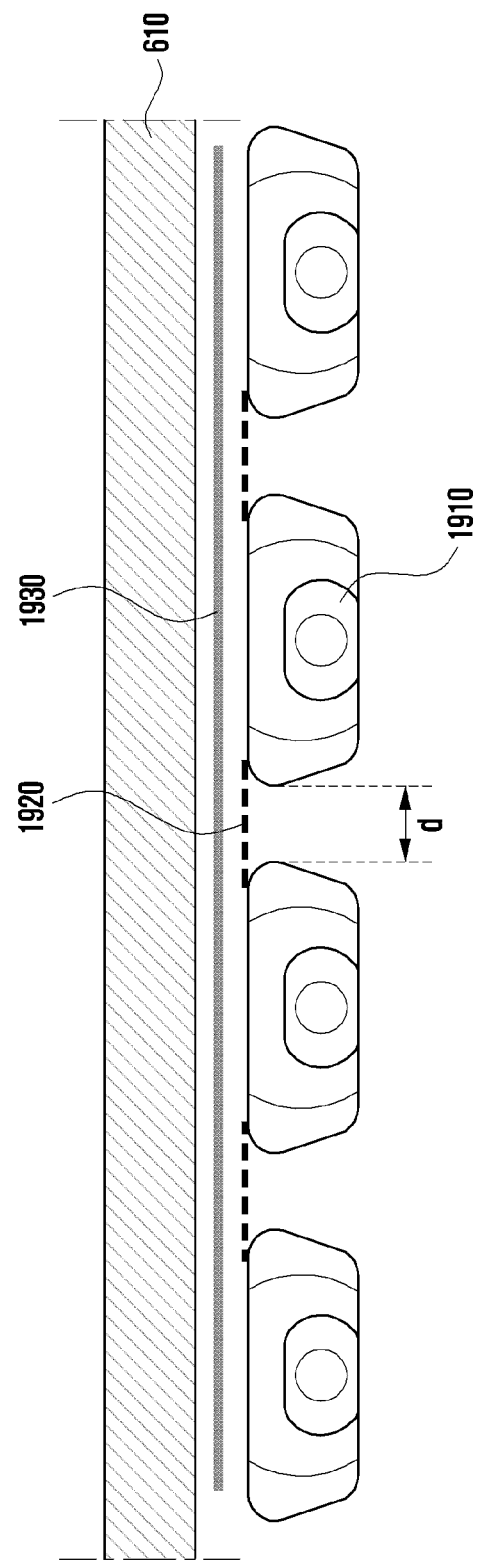
FIG. 19 is a view illustrating a form of a bending plate according to various embodiments of the disclosure.

FIG. 19 is a view illustrating a form of a bending plate according to various embodiments of the disclosure.

Referring to FIG. 19, multi-bars 1910 of the bendable member (e.g., bendable member 620 of FIG. 8) may be disposed at predetermined intervals d. A bending plate 1920 (e.g., bending plate 1620 of FIG. 17A) may be disposed in the interval d between the multi-bars 1910 of the bendable member (e.g., bendable member 620 of FIG. 8). The bending plate 1920 may be formed of a metal material or a rubber (e.g., urethane or liquid silicone rubbers (LSR)) material, and may include a lattice pattern (e.g., reduction section 1624 of FIG. 17) in which at least a part of the plate (e.g., support plate 1622 of FIG. 17A) is uniformly cut. The bending plate 1920 may be disposed between the multi-bars 1910, and may be attached to the multi-bars 1910. An adhesive member 1930 (e.g., adhesive tape) may be disposed on the upper parts of the multi-bars 1910 and the bending plate 1920. The adhesive member 1930 may be disposed between the display 610 and the multi-bars 1910 and between the display 610 and the bending plate 1920. The multi-bars 1910 may be connected to one another by the bending plate 1920 and the adhesive member 1930. The multi-bars 1910 and the bending plate 1920 may be attached to the lower surface of the display 610 by the adhesive member 1930.

Figure 20:
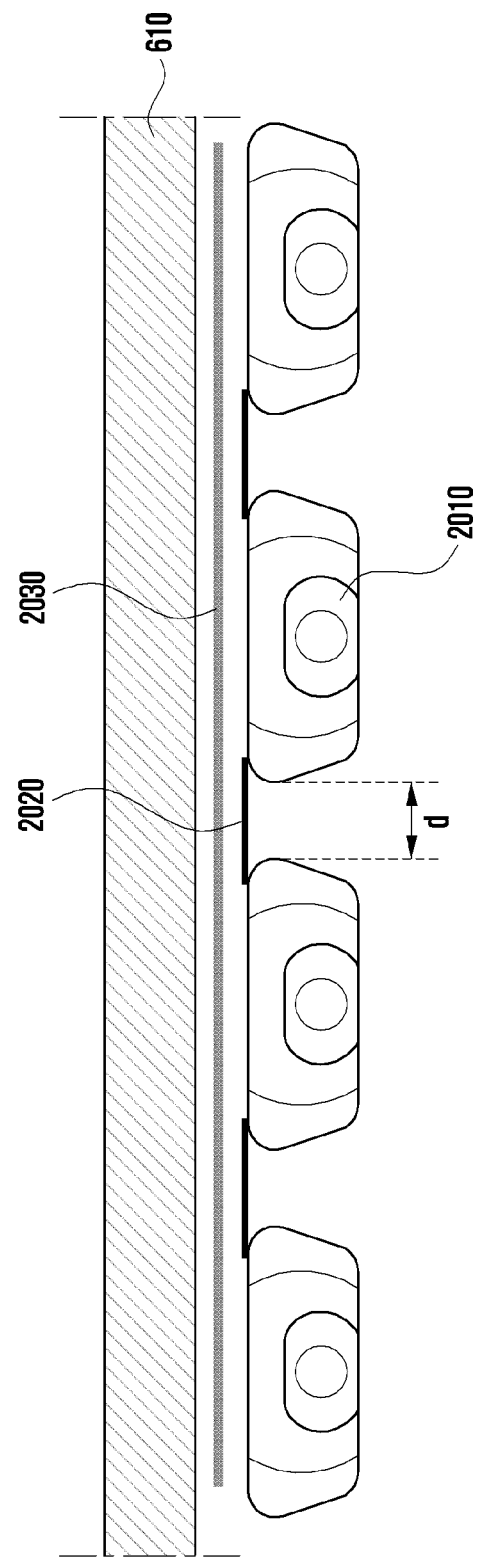
FIG. 20 is a view illustrating a form of a bending plate according to various embodiments of the disclosure.

FIG. 20 is a view illustrating a form of a bending plate according to various embodiments of the disclosure.

Referring to FIG. 20, multi-bars 2010 of the bendable member (e.g., bendable member 620 of FIG. 8) may be disposed at predetermined intervals d. A bending plate 2020 may be disposed in the interval d between the multi-bars 2010 of the bendable member (e.g., bendable member 620 of FIG. 8). The bending plate 2020 may include the support plate (e.g., support plate 1622 of FIG. 17A) having flat upper and lower surfaces. The bending plate 2020 may be formed of a metal material or a rubber (e.g., urethane or liquid silicone rubbers (LSR)) material. The bending plate 2020 may be formed of a material that is flexibly deformed against the compressive force and the tensile stress, and has a small change of thickness when the compressive force and the tensile stress are applied thereto.

As an embodiment, an adhesive member 2030 (e.g., adhesive tape) may be disposed on the upper parts of the multi-bars 2010 and the bending plate 2020. The adhesive member 2030 may be disposed between the display 610 and the multi-bars 2010 and between the display 610 and the bending plate 2020. The multi-bars 2010 may be connected to one another by the bending plate 2020 and the adhesive member 2030. The multi-bars 2010 and the bending plate 2020 may be attached to the lower surface of the display 610 by the adhesive member 2030.

Figure 21:
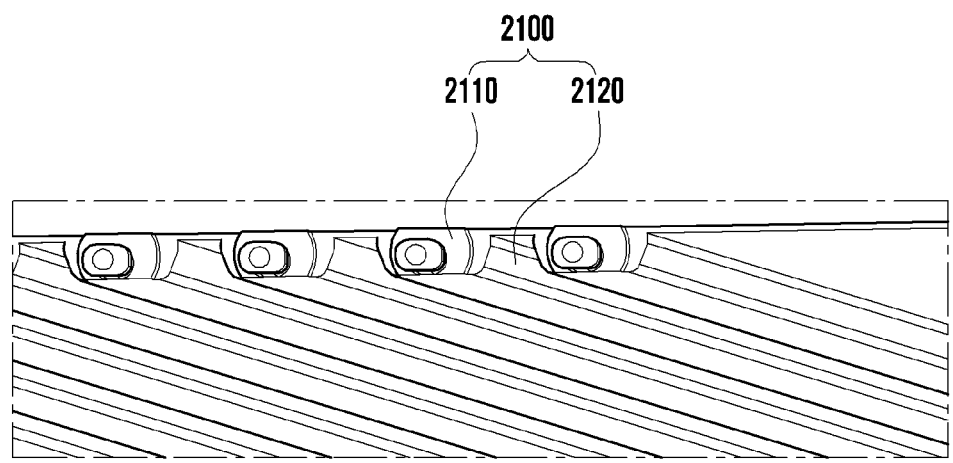
FIG. 21 is a view illustrating a bendable member according to various embodiments of the disclosure.
Figure 22:
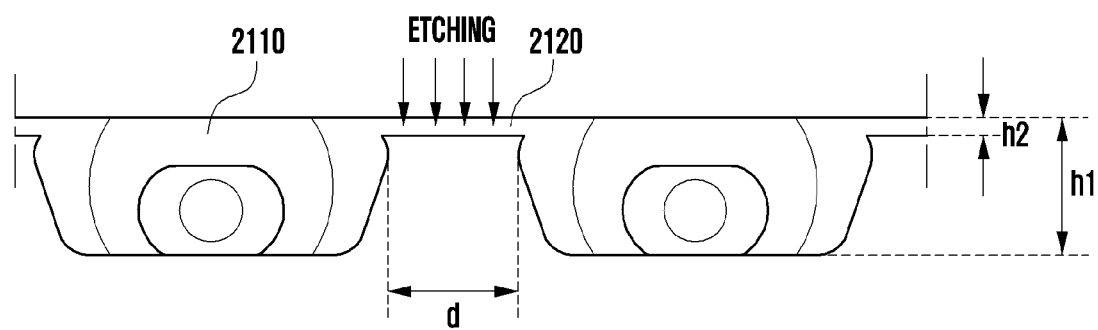
FIG. 22 is a view explaining a method for forming a bendable member according to various embodiments of the disclosure.

FIG. 21 is a view illustrating a bendable member according to various embodiments of the disclosure. FIG. 22 is a view explaining a method for forming a bendable member according to various embodiments of the disclosure.

Referring to FIGS. 21 and 22, a bendable member 2100 may be formed in the form in which multi-bars (e.g., multi-bars 1610 of FIG. 16) and a bending plate (e.g., bending plate 1620 of FIG. 16) are united.

According to an embodiment, the bendable member 2100 may include a plurality of multi-bars 2110 and a plurality of bending parts 2120. Each of the bending parts 2120 may be disposed between the plurality of multi-bars 2110. The plurality of multi-bars 2110 may be formed to have a first thickness h1, and the plurality of bending parts 2120 may have a second thickness h2 that is thinner than the first thickness h1. The upper surface of the plurality of multi-bars 2110 and the upper surface of the plurality of bending parts 2120 may be located on substantially the same plane. Since the bending parts 2120 are formed with a thin thickness of the second thickness h2, the bendable member 2100 can be flexibly bent in the bendable section (e.g., bendable section 610b of FIG. 10), and the curved shape of the display 610 can be implemented.

As an embodiment, in forming the bendable member 2100, the plurality of multi-bars 2110 may be formed by cutting a metal material, and the plurality of bending parts 2120 may be formed by reducing the thickness through selective etching of the part between the plurality of multi-bars 2110.

As an embodiment, in forming the bendable member 2100, the multi-bars 2110 may be formed by insert-injecting a metal material or a rubber (e.g., urethane or liquid silicone rubbers (LSR)) material, and the bending parts 2120 may be formed between the multi-bars 2110.

As an example, in forming the bendable member 2100, the multi-bars 2110 and the bending parts 2120 may be formed by double-injecting the metal material or the rubber (e.g., urethane or liquid silicone rubbers (LSR)) material.

An electronic device (e.g., electronic device 101 of FIG. 1, electronic device 300 of FIGS. 2 to 5, electronic device 600 of FIG. 6, or electronic device 600 of FIG. 10) according to various embodiments of the disclosure may include a first housing (e.g., first housing 360 of FIG. 3 or first housing 630 of FIG. 6), a second housing (e.g., second housing 370 of FIG. 3 or second housing 660 of FIG. 6), a flexible display 310 or 610, a bendable member (e.g., bendable member 620 of FIGS. 6 and 7), and a bending plate (e.g., bending plate 1320 of FIGS. 13 and 14, bending plate 1620 of FIG. 16, or bending plate 1810 of FIG. 18A). The second housing 370 or 660 may slide in a first housing to cause at least a part of the second housing to be drawn out of the first housing 360 or 630, and may slide in a second direction to cause the at least a part of the second housing to enter the first housing 360 or 630. The flexible display (e.g., display 310 of FIGS. 2 and 3, display 610 of FIGS. 6, 8, 10 and 12, display 610 of FIGS. 13 and 14, or display 610 of FIGS. 16 and 19) may be disposed in a space formed by the first housing 360 or 630 and the second housing 370 or 660, and may include a first area (e.g., fixed area 314 of FIG. 3) visible to an outside, and a second area (e.g., expanded area 312 of FIG. 3) extending from the first area (e.g., fixed area 314 of FIG. 3), accommodated inside the flexible display in a closed state, and visible to the outside in an open state. The bendable member 620 may be disposed on a rear side of the flexible display 310 or 610 to support the flexible display 310 or 610 in the closed state and in the open state, and may include a plurality of multi-bars 622, 1310, and 1610 disposed at predetermined intervals. The bending plate 1320, 1620, or 1810 may be attached to the flexible display 310 or 610 and the plurality of multi-bars (e.g., multi-bars 622 of FIGS. 7 and 8, multi-bars 1310 of FIG. 13, or multi-bars 1610 of FIG. 16).

According to an embodiment, the electronic device 101, 300, or 600 may include a first adhesive member (e.g., first adhesive member 1330 of FIG. 13 or first adhesive member 1630 of FIG. 16) attaching the bending plate 1320, 1620, or 1810 to a lower surface of the flexible display 310 or 610, and a second adhesive member (e.g., second adhesive member 1340 of FIG. 13 or second adhesive member 1640 of FIG. 16) attaching the bending plate 1320, 1620, or 1810 to an upper surface of the bendable member 620.

According to an embodiment, the first adhesive member 1330 or 1630 may be attached to an entire upper surface of the bending plate 1320, 1620, or 1810.

According to an embodiment, the second adhesive member 1340 or 1640 may be attached to an entire lower surface of the bending plate 1320, 1620, or 1810.

According to an embodiment, the second adhesive member 1340 or 1640 may be attached to a part overlapping upper surfaces of the multi-bars 622, 1310, or 1610 on a lower surface of the bending plate 1320, 1620, or 1810.

According to an embodiment, the bending plate 1320, 1620, or 1810 may include a support plate (e.g., support plate 1322 of FIG. 13 or support plate 1622 of FIG. 16) located to overlap upper surfaces of the plurality of multi-bars 622, 1310, or 1610 and a lower surface of the flexible display 310 or 610.

According to an embodiment, the bending plate 1320, 1620, or 1810 may include a reduction section (e.g., reduction section 1324 of FIG. 13 or reduction section 1624 of FIG. 16) disposed to correspond to spaces among the plurality of multi-bars 622, 1310, and 1610, and formed by uniformly cutting at least a part of the support plate 1322 or 1622 or formed by at least a part of support plate 1322 or 1622 with uniform cuts.

According to an embodiment, the bending plate 1320, 1620, or 1810 may be disposed between a lower part of the second area (e.g., expanded area 312 of FIG. 3) of the display and an upper part of the bendable member 620.

According to an embodiment, the bending plate 1320, 1620, or 1810 may be disposed among the plurality of multi-bars 622, 1310, or 1610 to connect the plurality of multi-bars 622, 1310, or 1610 to one another.

According to an embodiment, the bending plate 1320, 1620, or 1810 may be formed of a metal material or a rubber material.

According to an embodiment, each of the plurality of multi-bars 622, 1310, or 1610 may have an upper surface formed with a first width, a lower surface formed with a second width that is narrower than the first width, and a lateral side formed between the upper surface and the lower surface to be inclined at a predetermined angle.

According to an embodiment, the lateral surface of each of the plurality of multi-bars 622, 1310, or 1610 may be formed to be inclined by 100° to 110° so that the upper surface becomes wider than the lower surface.

According to an embodiment, a corner of the upper side and a corner of the lower side of each of the plurality of multi-bars 622, 1310, or 1610 may be formed to have a predetermined curvature. A display assembly of an electronic device 101, 300, or 600 according to various embodiments of the disclosure may include a flexible display 310 or 610, a bendable member 620, and a bending plate 1320, 1620, or 1810. The flexible display 310 or 610 may include a first area (e.g., fixed area 314 of FIG. 3) disposed to be seen from an outside, and a second area (e.g., expanded area 312 of FIG. 3) extending from the first area (e.g., fixed area 314 of FIG. 3), accommodated inside the flexible display in a closed state, and disposed to be seen from the outside in an open state. The bendable member 620 may be disposed on a rear side of the flexible display 310 or 610 to support the flexible display 310 or 610 in the closed state and in the open state, and may include a plurality of multi-bars 622, 1310, or 1610 disposed at predetermined intervals. The bending plate 1320, 1620, or 1810 may be attached to a lower part of the flexible display 310 or 610, and may be attached to the plurality of multi-bars 622, 1310, or 1610.

According to an embodiment, the bending plate 1320, 1620, or 1810 may include a support plate 1322 or 1622 located to overlap upper sides of the plurality of multi-bars 622, 1310, or 1610 and a lower side of the flexible display 310 or 610.

According to an embodiment, the bending plate 1320, 1620, or 1810 may include a reduction section 1324 or 1624 disposed to correspond to spaces among the plurality of multi-bars 622, 1310, or 1610 and formed by uniformly cutting at least a part of the support plate 1322 or 1622.

According to an embodiment, the bending plate 1320, 1620, or 1810 may be disposed between a lower part of the second area (e.g., expanded area 312 of FIG. 3) of the display and an upper part of the bendable member 620.

According to an embodiment, the bending plate 1320, 1620, or 1810 may be disposed among the plurality of multi-bars 622, 1310, or 1610 to connect the plurality of multi-bars 622, 1310, or 1610 to one another.

According to an embodiment, the display assembly may include a first adhesive member 1330 or 1630 attaching the bending plate 1320, 1620, or 1810 to a lower surface of the flexible display 310 or 610, and a second adhesive member 1340 or 1640 attaching the bending plate 1320, 1620, or 1810 to an upper surface of the bendable member 620.

According to an embodiment, the first adhesive member 1330 or 1630 may be attached to an entire upper surface of the bending plate 1320, 1620, or 1810. The second adhesive member 1340 or 1640 may be attached to an entire lower surface of the bending plate 1320, 1620, or 1810, or may be attached to a part overlapping upper surface of the multi-bars 622, 1310, or 1610 on a lower surface of the bending plate 1320, 1620, or 1810.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
   a first housing;
   a second housing configured to be movably combined with the first housing, wherein the electronic device has an open state where the second housing is drawn out from the first housing or a closed state where the second housing is entered into the first housing;
   a flexible display disposed on the first housing and the second housing and including:
      a first area exposed to an outside of the electronic device both in the open state and the closed state; and
      a second area extending from the first area, accommodated inside a space formed by the first housing and the second housing while the electronic device is in the closed state, and exposed to the outside of the electronic device in the open state;
   a multi-bar supporting at least part of the flexible display, the multi-bar including a plurality of bars disposed at predetermined intervals; and
   a bending plate disposed between the flexible display and the multi-bar, the bending plate comprises a plurality of support plate parts and a plurality of lattice pattern parts, each of which is alternately arranged,
   wherein each of the plurality of lattice pattern parts is located to correspond to and overlap a space between adjacent bars of the plurality of bars, and each of the plurality of support plate parts is attached to an upper surface of each of the plurality of bars, respectively.

2. The electronic device of claim 1, comprising:
   a first adhesive member configured to attach the bending plate to a lower surface of the flexible display; and a second adhesive member configured to attach the bending plate to an upper surface of the multi-bar.

3. The electronic device of claim 2, wherein the first adhesive member is attached to an entire upper surface of the bending plate.

4. The electronic device of claim 3, wherein the second adhesive member is attached to an entire lower surface of the bending plate.

5. The electronic device of claim 3, wherein the second adhesive member is attached to a part of the bending plate overlapping the upper surfaces of the bars on a lower surface.

6. The electronic device of claim 1, wherein the plurality of lattice pattern parts are formed with uniform cuts.

7. The electronic device of claim 1, wherein the bending plate is disposed between a lower part of the second area of the flexible display and an upper part of the multi-bar.

8. The electronic device of claim 1, wherein the bending plate connects each of the plurality of bars.

9. The electronic device of claim 1, wherein the bending plate is formed of a metal material or a rubber material.

10. The electronic device of claim 1, wherein each of the plurality of bars includes:
an upper surface formed with a first width,
a lower surface formed with a second width that is narrower than the first width, and
a lateral surface formed at an incline at a predetermined angle between the upper surface and the lower surface.

11. The electronic device of claim 10, wherein the lateral surface of each of the plurality of bars is formed to be inclined by 100° to 110° so that the upper surface is wider than the lower surface.

12. The electronic device of claim 10, wherein a corner of the upper surface and a corner of the lower surface for each of the plurality of bars are formed to have a predetermined curvature.

13. A display assembly of an electronic device comprising:
a flexible display including:
a first area visible from an outside of the electronic device both in an open state and a closed state; and
a second area extending from the first area, invisible from the outside in the closed state, and visible from the outside in the open state;
a multi-bar disposed on a rear surface of the flexible display and configured to support the flexible display in the closed state and in the open state, the multi-bar including a plurality of bars disposed at predetermined intervals; and
a bending plate disposed between the flexible display and the multi-bar,
wherein the bending plate comprises a support plate and a reduction section, and the support plate is located to correspond to and attach to an upper surface of each of the plurality of bars and the reduction section is located to correspond to and overlap the predetermined intervals.

14. The display assembly of claim 13, wherein the bending plate comprises the support plate located to overlap upper sides of the plurality of bars and a lower surface of the flexible display.

15. The display assembly of claim 13, wherein the bending plate is disposed between a lower part of the second area of the flexible display and an upper part of the multi-bar.

16. The display assembly of claim 13, wherein the bending plate is disposed among the plurality of bars to connect between each of the plurality of bars.

17. The display assembly of claim 13, comprising:
a first adhesive member configured to attach the bending plate to a lower surface of the flexible display; and
a second adhesive member configured to attach the bending plate to an upper surface of the multi-bar.

18. The display assembly of claim 17, wherein the first adhesive member is attached to an entire upper surface of the bending plate, and
the second adhesive member is attached to:
an entire lower surface of the bending plate, or
a part of the bending plate overlapping the upper surfaces of the bars on a lower surface of the bending plate.

* * * * *